US012690285B2

(12) United States Patent
Lee et al.

(10) Patent No.: US 12,690,285 B2
(45) Date of Patent: Jul. 21, 2026

(54) IMAGE SENSOR AND METHOD FOR FABRICATING THE SAME

(71) Applicant: Samsung Electronics Co., Ltd., Suwon-si (KR)

(72) Inventors: Ju Hee Lee, Suwon-si (KR); Dong Mo Im, Suwon-si (KR); Ji Hee Yang, Suwon-si (KR); Tae-Hun Lee, Suwon-si (KR); Ji Hun Lim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 554 days.

(21) Appl. No.: 18/166,241

(22) Filed: Feb. 8, 2023

(65) Prior Publication Data

US 2023/0343801 A1 Oct. 26, 2023

(30) Foreign Application Priority Data

Apr. 22, 2022 (KR) ........................ 10-2022-0050090

(51) Int. Cl.
H10F 39/00 (2025.01)
H10F 39/18 (2025.01)

(52) U.S. Cl.
CPC ..... H10F 39/80373 (2025.01); H10F 39/014 (2025.01); H10F 39/182 (2025.01); (Continued)

(58) Field of Classification Search
CPC ............................................... H10F 39/80373
See application file for complete search history.

(56) References Cited

U.S. PATENT DOCUMENTS 9,865,635 B2 * 1/2018 Park .................. H10F 39/80373
11,069,728 B2 * 7/2021 Takahashi ......... H10F 39/80377
(Continued)

FOREIGN PATENT DOCUMENTS

KR 10-2001-0017325 A 3/2001
KR 10-2005-0086132 A 8/2005
(Continued)

OTHER PUBLICATIONS

English Machine Translation of KR 20050103360 A (Year: 2005).*
Office Action in Korean Appln. No. KR 10-2022-0050090, mailed on Sep. 20, 2025, 19 pages (with English translation).

*Primary Examiner* — Yara B Green
*Assistant Examiner* — Erika H Son
(74) *Attorney, Agent, or Firm* — Fish & Richardson P.C.

(57) ABSTRACT

An image sensor includes a substrate, a photoelectric conversion region in the substrate with the substrate defining a substrate trench on the photoelectric conversion region, a floating diffusion region adjacent to a side surface of the substrate trench, in the substrate, a gate dielectric film that extends along the side surface and a lower surface of the substrate trench and a transfer gate electrode which includes a lower gate that fills a portion of the substrate trench on the gate dielectric film and has a first width, and an upper gate that has a second width smaller than the first width on the lower gate. The gate dielectric film includes a lower dielectric film interposed between the substrate and the lower gate and has a first thickness, and an upper dielectric film adjacent to the floating diffusion region and has a second thickness greater than the first thickness.

20 Claims, 25 Drawing Sheets

(52) U.S. Cl.
  CPC ....... *H10F 39/8063* (2025.01); *H10F 39/807*
                (2025.01); *H10F 39/809* (2025.01)

(56)            References Cited

U.S. PATENT DOCUMENTS

| | | | | |
|---|---|---|---|---|
| 12,183,751 | B2 * | 12/2024 | Chen ..................... | H10F 39/014 |
| 2015/0243693 | A1 * | 8/2015 | Oh .................... | H10F 39/80373 |
| | | | | 257/292 |
| 2016/0027821 | A1 * | 1/2016 | Ahn ..................... | H10F 39/802 |
| | | | | 257/446 |
| 2020/0266223 | A1 | 8/2020 | Takahashi | |
| 2025/0133847 | A1 * | 4/2025 | Nishida ............ | H10F 39/80373 |

FOREIGN PATENT DOCUMENTS

| | | | | | |
|---|---|---|---|---|---|
| KR | 10-2005-0103360 | A | 10/2005 | | |
| KR | 20050103360 | A | * 10/2005 | ........... | H10D 64/513 |
| KR | 10-2006-0077091 | A | 7/2006 | | |
| KR | 10-2006-0093165 | A | 8/2006 | | |
| KR | 10-2007-0024992 | A | 3/2007 | | |
| KR | 10-2008-0004962 | A | 1/2008 | | |
| KR | 10-2011-0014899 | A | 2/2011 | | |
| KR | 10-2018-0087425 | A | 8/2018 | | |
| KR | 10-2021-0070573 | A | 6/2021 | | |

* cited by examiner

IMAGE SENSOR AND METHOD FOR FABRICATING THE SAME

CROSS-REFERENCE TO RELATED APPLICATION

This application claims priority from Korean Patent Application No. 10-2022-0050090 filed on Apr. 22, 2022 in the Korean Intellectual Property Office, and all the benefits accruing therefrom under 35 U.S.C. § 119, the contents of which in its entirety are herein incorporated by reference.

BACKGROUND

Various example embodiments relate to an image sensor and/or a method for fabricating the same. More specifically, various example embodiments relate to a CMOS type image sensor including a vertical transfer gate and/pr a method for fabricating the same.

An image sensor is or includes one of semiconductor elements that convert optical information into an electric signal. Such an image sensor may include a charge coupled device (CCD) image sensor and/or a complementary metal-oxide semiconductor (CMOS) image sensor.

The image sensor may be configured in the form of a package. At this time, the package protects or partly protects the image sensor, and may be configured with a structure which allows light to enter a photo-receiving surface or a sensing area of the image sensor.

SUMMARY

Aspects of the example embodiments provide an image sensor in which a gate-induced drain leakage (GIDL) current is reduced.

Alternatively or additionally, aspects of example embodiments also provide a method for fabricating an image sensor in which a gate-induced drain leakage (GIDL) is reduced.

However, aspects of example embodiments are not restricted to the one set forth herein. The above and other aspects of example embodiments will become more apparent to one of ordinary skill in the art to inventive concepts pertains by referencing the detailed description given below.

According to some example embodiments, there is provided an image sensor comprising a substrate, a photoelectric conversion region in the substrate, the substrate defining a substrate trench on the photoelectric conversion region, a floating diffusion region in the substrate and adjacent to a side surface of the substrate trench, a gate dielectric film extending along the side surface of and a lower surface of the substrate trench and along a transfer gate electrode which includes a lower gate that fills a portion of the substrate trench on the gate dielectric film and has a first width, and an upper gate having a second width less than the first width on the lower gate. The gate dielectric film includes a lower dielectric film which is interposed between the substrate and the lower gate and has a first thickness, and an upper dielectric film which is adjacent to the floating diffusion region and has a second thickness greater than the first thickness.

According various example embodiments, there is provided an image sensor comprising a substrate, a photoelectric conversion region in the substrate, the substrate defining a substrate trench on the photoelectric conversion region, a floating diffusion region in the substrate and adjacent to a side surface of the substrate trench, a gate dielectric film that extends along the side surface and a lower surface of the substrate trench, a transfer gate electrode which includes a lower gate that fills a portion of the substrate trench on the gate dielectric film, an upper gate spaced apart from the side surface of the gate dielectric film on the lower gate, and a residual gate film that extends along the gate dielectric film on the lower gate and a gate spacer on the lower gate interposed between the upper gate and the residual gate film. The gate dielectric film includes a lower dielectric film which is interposed between the substrate and the lower gate and has a first thickness, and an upper dielectric film which is interposed between the floating diffusion region and the residual gate film and has a second thickness greater than the first thickness.

According to various example embodiments, there is provided an image sensor comprising a first substrate including a first side and a second side opposite to each other, a photoelectric conversion region in the first substrate, a transfer gate electrode at least partially embedded in the first substrate and on the first side of the first substrate, a gate dielectric film interposed between the first substrate and the transfer gate electrode, a floating diffusion region adjacent to a side surface of the transfer gate electrode and in the first substrate, a first wiring structure electrically connected to either or both of the transfer gate electrode or the floating diffusion region and on the first side of the first substrate, and a micro lens on the second side of the first substrate. The transfer gate electrode includes a lower gate adjacent to the photoelectric conversion region, and an upper gate spaced apart from a side surface of the gate dielectric film, on the lower gate, and the gate dielectric film includes a lower dielectric film which is interposed between the first substrate and the lower gate and has a first thickness, and an upper dielectric film which is adjacent to the floating diffusion region and has a second thickness greater than the first thickness.

BRIEF DESCRIPTION OF THE DRAWINGS

The above and other aspects and features of various example embodiments will become more apparent by describing in detail example embodiments thereof with reference to the attached drawings, in which:

Figure 26:
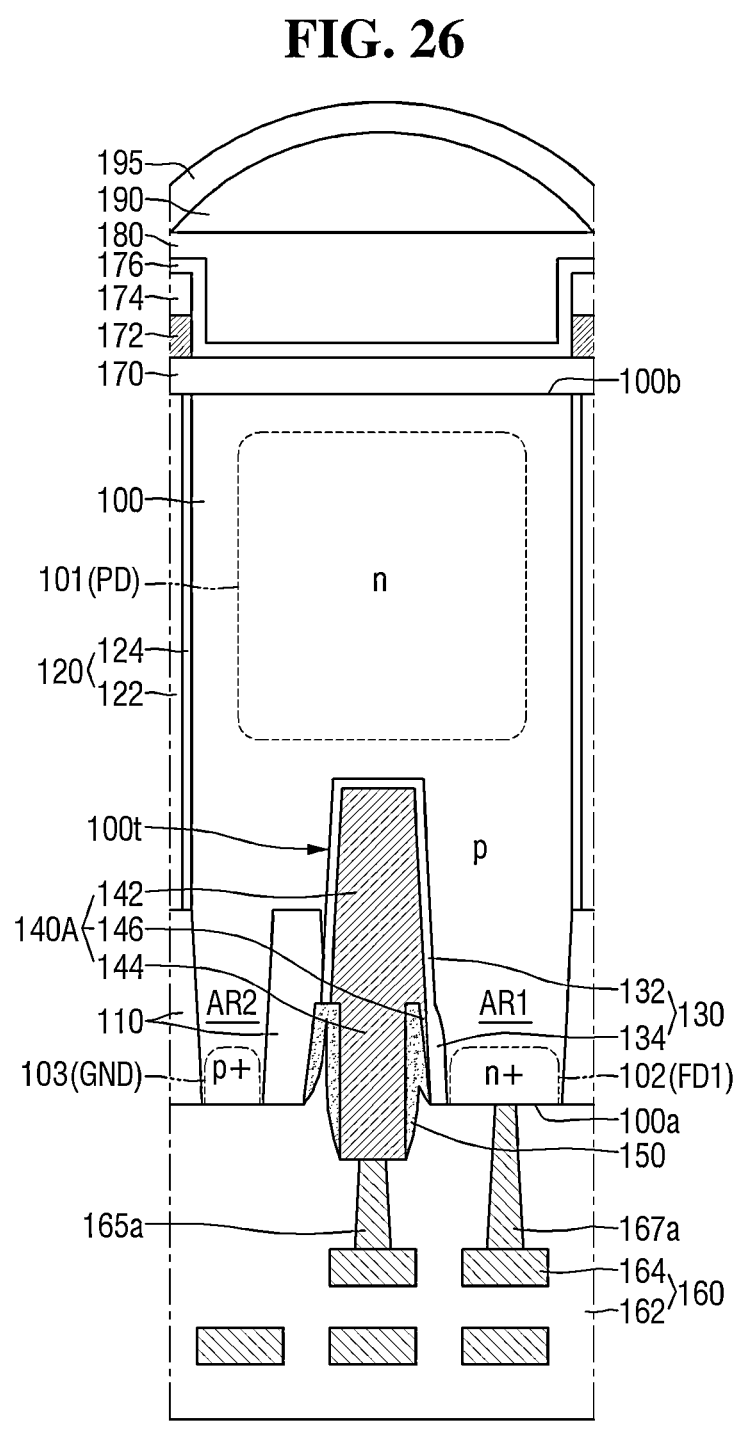

FIGS. 17 to 26 are intermediate stage diagrams for explaining a method for fabricating an image sensor according to some example embodiments.

DETAILED DESCRIPTION OF EXAMPLE EMBODIMENTS

Hereinafter, an image sensor according to an example embodiment will be described referring to FIGS. 1 to 16.

Figure 1:
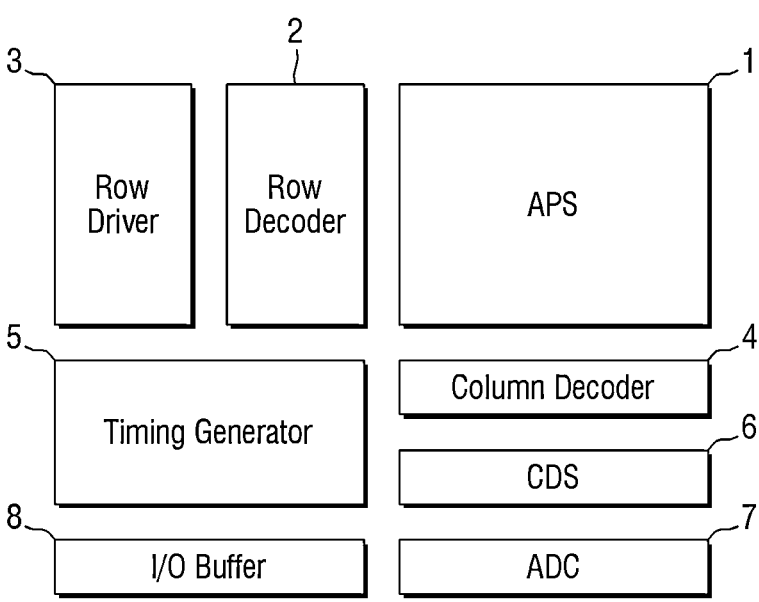
FIG. 1 is an example block diagram for explaining an image sensor according to some example embodiments.

FIG. 1 is an example block diagram for explaining an image sensor according to some example embodiments.

Referring to FIG. 1, the image sensor according to some example embodiments includes an active pixel sensor array (APS) 1, a row decoder 2, a row driver 3, a column decoder 4, a timing generator 5, a correlated double sampler (CDS) 6, an analog-to-digital converter (ADS) 7, and an I/O buffer 8. Any or all of the elements described with reference to FIG. 1 may communicate with any or all other elements described with reference to FIG. 1; for example, any element may engage in one-way and/or two-way and/or broadcast communication with any or all other elements in FIG. 1, to transfer or exchange information such as but not limited to data and/or commands, in a serial and/or parallel manner, via a wireless and/or a wired bus (not illustrated).

The active pixel sensor array 1 includes a plurality of unit pixels arranged two-dimensionally, and may convert an optical signal into an electric signal. The active pixel sensor array 1 may be driven by a plurality of drive signals such as one or more of a pixel selection signal, a reset signal, and a charge transfer signal from the row driver 3. Further, the electrical signal converted by the active pixel sensor array 1 may be provided to the correlated double sampler 6.

The row driver 3 may provide the active pixel sensor array 1 with a plurality of drive signals for driving a plurality of unit pixels according to the result decoded by the row decoder 2. When the unit pixels are arranged in the form of a matrix, a drive signal may be provided for each row.

The timing generator 5 may provide the timing signal and the control signal to the row decoder 2 and the column decoder 4.

The correlated double sampler (CDS) 6 may receive, hold, and sample the electrical signal generated by the active pixel sensor array 1. The correlated double sampler 6 may doubly sample a specific noise level and a signal level due to an electric signal, and may output a difference level corresponding to a difference between the noise level and the signal level.

The analog-to-digital converter (ADC) 7 may convert an analog signal corresponding to the difference level output from the correlated double sampler 6 into a digital signal and output the digital signal.

The I/O buffer 8 latches the digital signal, and the latched signal may sequentially output the digital signal to a video signal processing unit (not shown) according to the decoding result from the column decoder 4.

Figure 2:
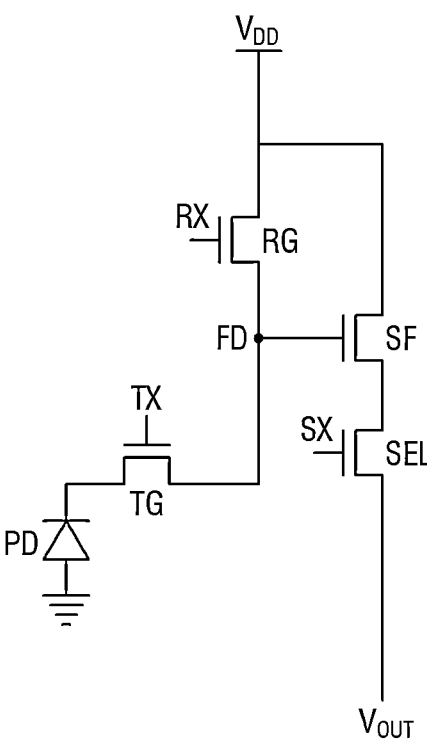
FIG. 2 is an example circuit diagram for explaining an image sensor according to some example embodiments.

FIG. 2 is an example circuit diagram for explaining an image sensor according to some example embodiments.

Referring to FIG. 2, the unit pixel of the image sensor according to some example embodiments may include a photoelectric conversion element (PD), a transfer transistor (TG), a floating diffusion region (FD), a reset transistor (RG), a source follower transistor (SF), and a selection transistor (SEL). Although each of the transfer transistor TG, the reset transistor RG, the source flower transistor SF, and the selection transistor SEL are illustrated as being NMOS transistors, example embodiments are not limited thereto, and one or more of the transfer transistor TG, the reset transistor RG, the source flower transistor SF, and the selection transistor SEL may be a PMOS transistor. Furthermore, various electrical properties, such as but not limited to threshold voltages and/or driver currents, of each of the transfer transistor TG, the reset transistor RG, the source flower transistor SF, and the selection transistor SEL may be the same as, or different form, others of the transfer transistor TG, the reset transistor RG, the source flower transistor SF, and the selection transistor SEL.

The photoelectric conversion element PD may generate electric charges in proportion to the amount of light that is incident from the outside. The photoelectric conversion element PD may be coupled to the transfer transistor TX that transfers the generated and accumulated electric charges to the floating diffusion region FD. Because the floating diffusion region FD is or includes a region for switching the electric charges to voltage, and has a parasitic capacitance, the electric charges may be accumulatively stored.

One end of the transfer transistor TX may be connected to the photoelectric conversion element PD, and the other end of the transfer transistor TX may be connected to the floating diffusion region FD. The transfer transistor TX may be formed of a transistor driven by a dynamically determined (or, alternatively, predetermined) bias (e.g., transfer signal TX). For example, the transfer transistor TX may transfer the electric charges generated from the photoelectric conversion element PD to the floating diffusion region FD according to the transfer signals.

The source follower transistor SF may amplify a change in electrical potential of the floating diffusion region FD to which the electric charges are sent from the photoelectric conversion element PD and output it to an output line VOUT. When the source follower transistor SF is turned on, a dynamically determined (or, alternatively, predetermined) electrical potential provided to a drain of the source follower transistor SF, for example, a power supply voltage $V_{DD}$, may be sent to a drain region of the selection transistor SEL.

The selection transistor SEL may select a unit pixel region to be read in units of a row. The selection transistor SEL may be made up of, e.g. may include a transistor that is driven by a selection line that applies a dynamically determined or predetermined bias (e.g., a row selection signal SX).

The reset transistor RX may periodically reset the floating diffusion region FD. The reset transistor RX may be made up of (e.g., may include) a transistor that is driven by a reset line that applies a dynamically determined or predetermined bias (e.g., a reset signal RX). When the reset transistor RX is turned on by the reset signal, a dynamically determined or predetermined electrical potential provided to the drain of the reset transistor RX, for example, the power supply voltage $V_{DD}$, may be sent to the floating diffusion FD.

Figure 3:
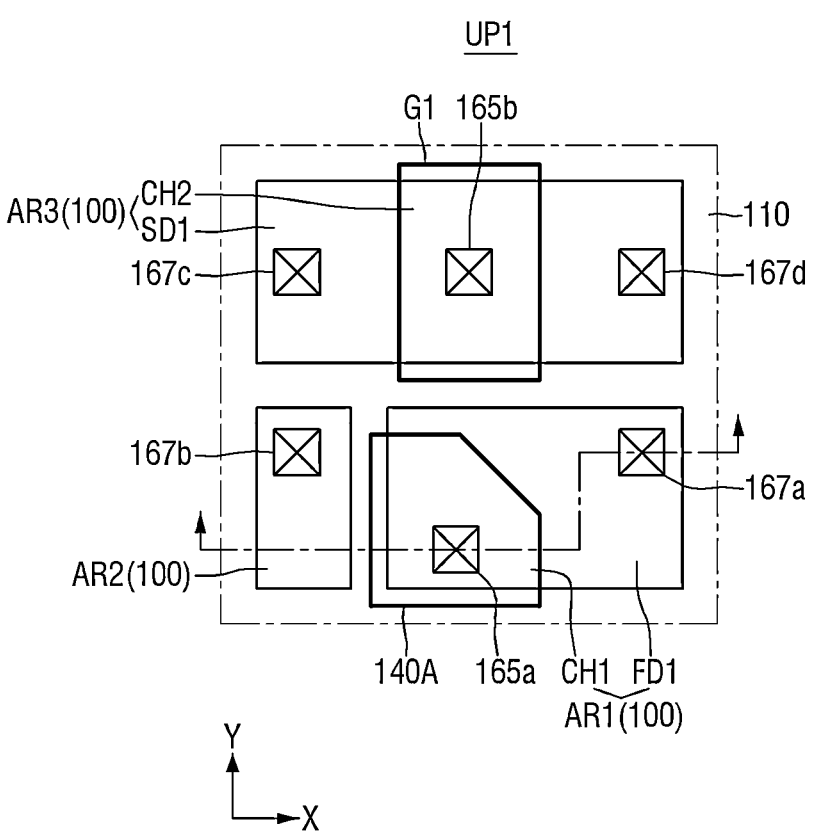
FIG. 3 is a schematic layout diagram for explaining the unit pixel of the image sensor according to some example embodiments.
Figure 4:
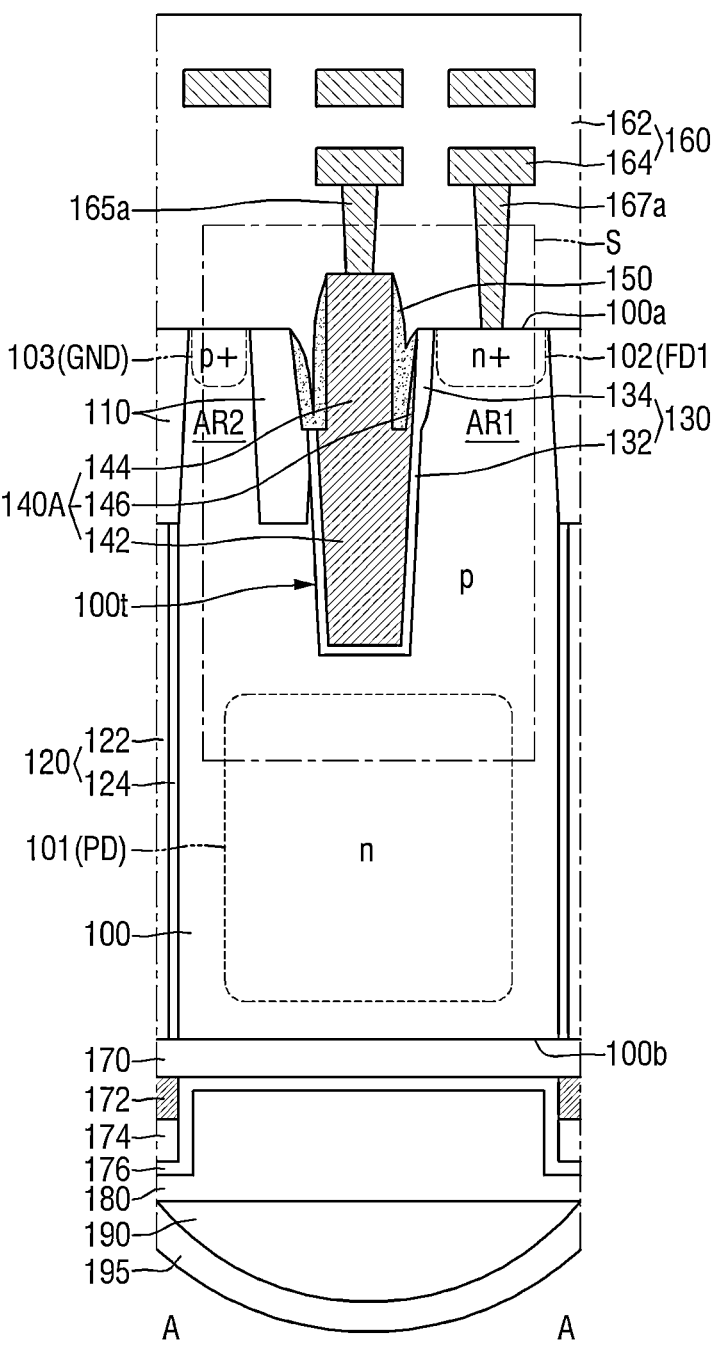
FIG. 4 is a schematic cross-sectional view taken along A-A of FIG. 3.
Figure 5:
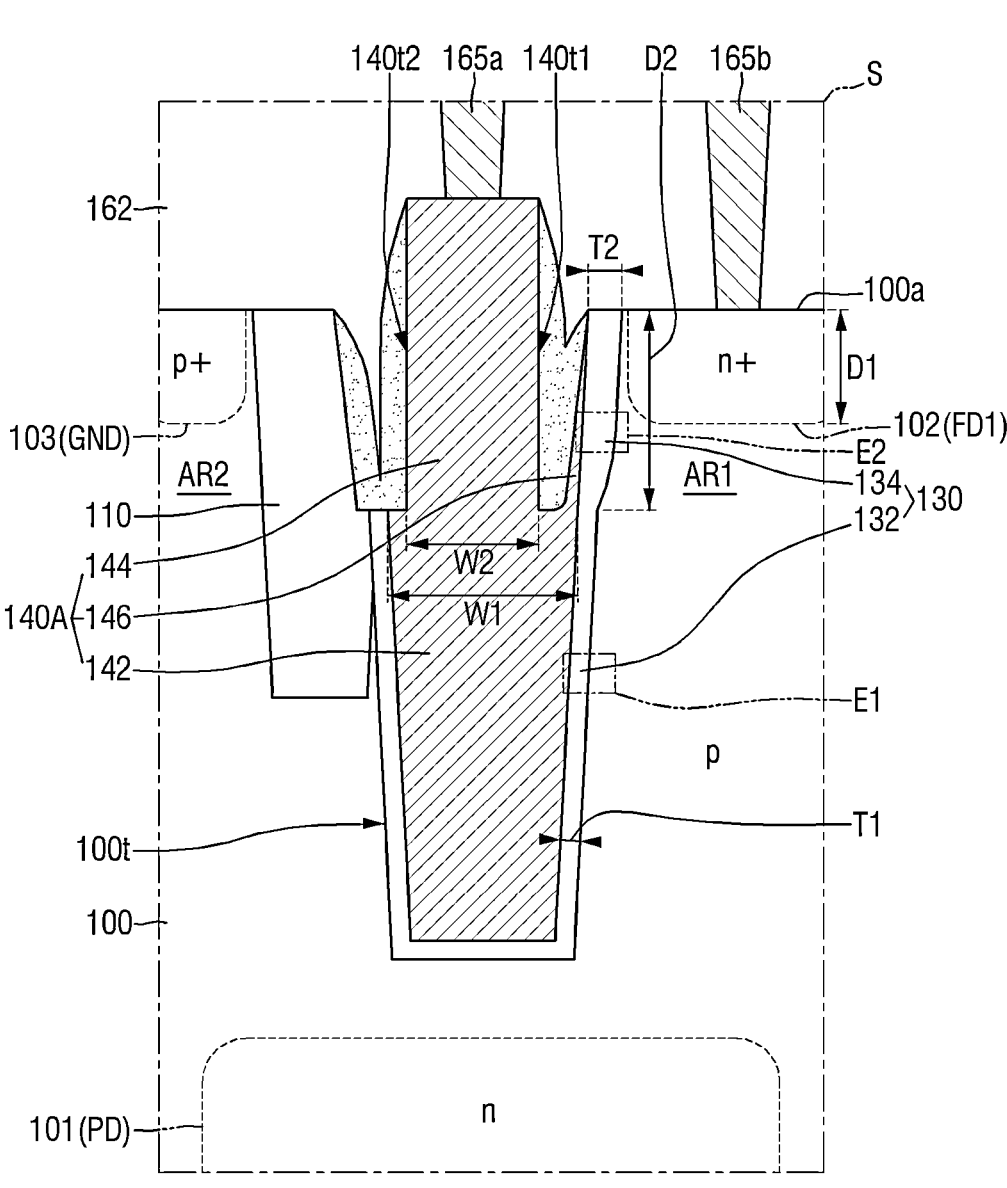
FIG. 5 is an enlarged view for explaining a region S of FIG. 4.
Figure 6:
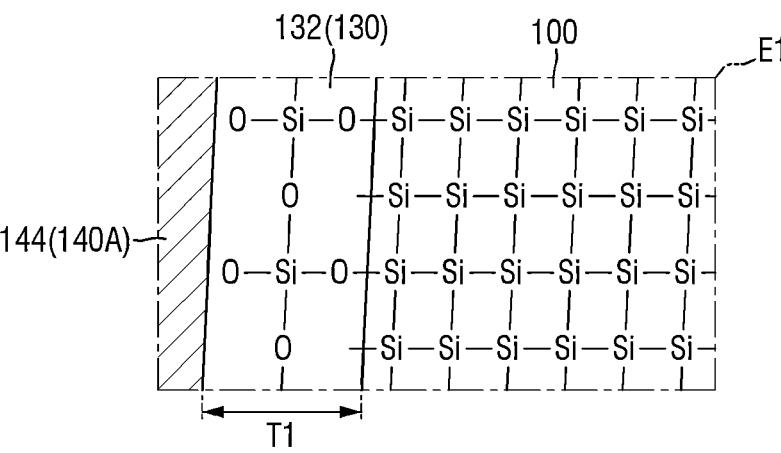
FIG. 6 is an enlarged view for explaining a region E1 of FIG. 5.
Figure 7:
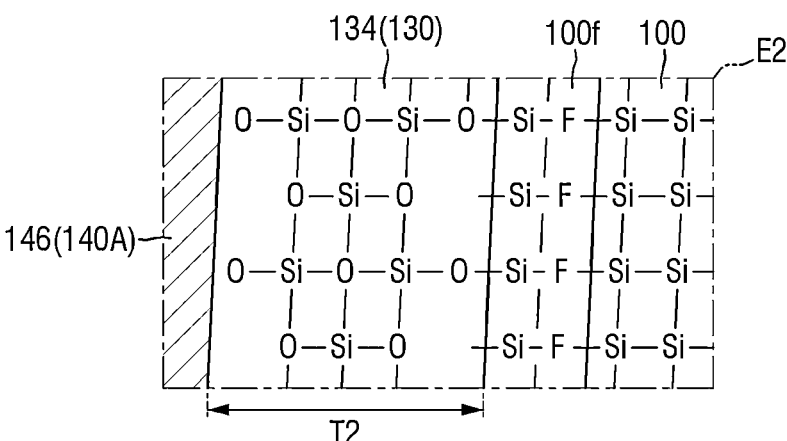
FIG. 7 is an enlarged view for explaining a region E2 of FIG. 5.

FIG. 3 is a schematic layout diagram for explaining the unit pixel of the image sensor according to some example embodiments. FIG. 4 is a schematic cross-sectional view taken along A-A of FIG. 3. FIG. 5 is an enlarged view for explaining a region S of FIG. 4. FIG. 6 is an enlarged view for explaining a region E1 of FIG. 5. FIG. 7 is an enlarged view for explaining a region E2 of FIG. 5.

The image sensor according to some example embodiments may include a plurality of unit pixels. The plurality of unit pixels may be arranged, for example, two-dimensionally (e.g., in the form of a matrix) in a plane including a first direction X and a second direction Y. For convenience of explanation, FIGS. 3 to 7 mainly explain one unit pixel (hereinafter, a first unit pixel UP1).

Referring to FIGS. 3 to 7, the image sensor according to some example embodiments includes a first substrate 100, a photoelectric conversion region 101, an element separation pattern 110, a gate dielectric film 130, a first transfer gate electrode 140, a gate spacer 150, a first wiring structure 160, a surface insulating film 170, grid patterns 172 and 174, a color filter 180 and a microlens 190.

The first substrate 100 may be or may include a semi-conductor substrate. For example, the first substrate 100 may be bulk silicon or SOI (silicon-on-insulator). The first substrate 100 may be or may include a silicon substrate and/or may include other substances, for example, one or more of silicon germanium, indium antimonide, lead tellurium compounds, indium arsenic, indium phosphide, gallium arsenide or gallium antimonide. Alternatively or additionally, the first substrate 100 may have an epitaxial layer formed on a base substrate.

The first substrate 100 may include a first side 100a and a second side 100b that are opposite to each other. In some example embodiments, the first side 100a may be referred to as a front side of the first substrate 100, and the second side 100b may be referred to as a back side of the first substrate 100. In some example embodiments, the second side 100b of the first substrate 100 may be a photo-receiving surface to which light is incident. For example, the image sensor according to some example embodiments may be or may include a back-illuminated (BSI) image sensor.

In some example embodiments, the first substrate 100 may have a first conductive type. For example, the first substrate 100 may include p-type impurities (e.g., one or more of boron (B), aluminum (Al), indium (In) or gallium (Ga)). In some example embodiments, the first conductive type will be described as a p-type, but this is merely an example, and the first conductive type may be an n-type.

The photoelectric conversion region 101 may be formed in the first substrate 100 of the first unit pixel UP1. The photoelectric conversion region 101 may correspond to the photoelectric conversion element PD of FIG. 2. For example, the photoelectric conversion region 101 may generate an electric charge in proportion to the amount of light incident from the outside.

The photoelectric conversion region 101 may have a second conductive type different from the first conductive type. For example, the photoelectric conversion region 101 may be formed by ion-implantation of n-type impurities, such as one or more of arsenic or phosphorus, into the p-type first substrate 100.

The element separation pattern 110 may be formed inside the first substrate 100. The element separation pattern 110 may extend from the first side 100a of the first substrate 100 toward the second side 100b of the first substrate 100. For example, the element separation pattern 110 may be formed by embedding an insulating material in a shallow trench formed by patterning the first substrate 100 including the first side 100a. The element separation pattern 110 may include, for example, but not limited to, at least one of silicon oxide, silicon nitride, or silicon oxynitride.

The element separation pattern 110 may define a plurality of unit pixels inside the first substrate 100. For example, at least a part of the element separation pattern 110 may be formed inside the first substrate 100 to surround the first unit pixel UP1.

Further, the element separation pattern 110 may define a plurality of active regions (e.g., first to third active regions AR1 to AR3) in the first unit pixel UP1. For example, the element separation pattern 110 may surround the first to third active regions AR1 to AR3 from a planar viewpoint.

The first active region AR1 may include a first floating diffusion region FD1 and a first channel region CH1.

The first floating diffusion region FD1 may be formed inside the first substrate 100 of the first active region AR1. The first floating diffusion region FD1 may have the second conductive type. For example, the first floating diffusion region FD1 may be the first impurity region 102 formed by ion-implantation of n-type impurities such as arsenic and/or phosphorus into the p-type first substrate 100. In some example embodiments, the first floating diffusion region FD1 may have a second conductive type at a higher impurity concentration than (e.g., several orders of magnitude more than) the photoelectric conversion region 101. For example, the first floating diffusion region FD1 may be formed by ion-implantation of n-type impurities (n+) of a high concentration into the p-type first substrate 100.

The first channel region CH1 may be formed inside the first substrate 100 of the first active region AR1. The first channel region CH1 may be formed between the photoelectric conversion region 101 and the first floating diffusion region FD1. The first channel region CH1 may have the first conductive type. For example, the first channel region CH1 may be a part of the p-type first substrate 100.

The second active region AR2 may be spaced apart from the first active region AR1 by the element separation pattern 110. In some example embodiments, the second active region AR2 may include a ground region GND to which a ground voltage is applied.

The ground region GND may be formed inside the first substrate 100 of the second active region AR2. The ground region GND may have the first conductive type. For example, the ground region GND may be the second impurity region 103 formed by ion-implantation of p-type impurities (p+) of a high concentration (e.g., several orders of magnitude more) into the p-type first substrate 100.

The third active region AR3 may be spaced apart from the first active region AR1 and the second active region AR2 by the element separation pattern 110. In some example embodiments, the third active region AR3 may include first source/drain regions SD1 and second channel region CH2.

The first source/drain regions SD1 may be formed inside the first substrate 100 of the third active region AR3. The first source/drain regions SD1 may have the second conductive type. For example, the first source/drain regions SD1 may be the first impurity region 102 formed by ion-implantation of n-type impurities such as arsenic and/or phosphorus into the p-type first substrate 100, respectively.

The second channel region CH2 may be formed inside the first substrate 100 of the third active region AR3. The second channel region CH2 may be formed between the first source/drain regions SD1. The second channel region CH2 may have the first conductive type. For example, the second channel region CH2 may be a part of the p-type first substrate 100.

In some example embodiments, a pixel separation pattern 120 may be formed inside the first substrate 100. The pixel separation pattern 120 may extend from a lower surface of the element separation pattern 110 toward the second side 100b of the first substrate 100. For example, the pixel separation pattern 120 may be formed by embedding an insulating material inside a deep trench formed by patterning the first substrate 100. The pixel separation pattern 120 may include, for example, but not limited to, at least one of silicon oxide, silicon nitride, or silicon oxynitride.

The pixel separation pattern 120 may define a plurality of unit pixels inside the first substrate 100. For example, the pixel separation pattern 120 may be formed inside the first substrate 100 to surround the first unit pixel UP1.

Although a width of the pixel separation pattern 120 is only shown to be constant, this is merely an example. Unlike that shown, in some example embodiments, the width of the pixel separation pattern 120 may decrease toward the second side 100*b* of the first substrate 100. Alternatively or additionally in some example embodiments, the width of the pixel separation pattern 120 may increase toward the second side 100*b* of the first substrate 100.

In some example embodiments, the pixel separation pattern 120 may completely penetrate the first substrate 100. For example, the lower surface of the pixel separation pattern 120 may be exposed from the second side 100*b* of the first substrate 100.

In some example embodiments, the pixel separation pattern 120 may include a filling pattern 122 and a spacer film 124.

The filling pattern 122 may extend from the lower surface of the element separation pattern 110 toward the second side 100*b* of the first substrate 100. The filling pattern 122 may include, but not limited to, a conductive material, for example, polysilicon (poly Si). In some example embodiments, a ground voltage and/or a negative voltage may be applied to the filling pattern 122. Such a filling pattern 122 may prevent, or reduce the impact from and/or probability of occurrence of electric charges generated by ESD (electrostatic discharge) or the like from accumulating on the surface of the first substrate 100 (e.g., the second side 100*b*) to effectively prevent or reduce ESD bruise defects.

The spacer film 124 may extend along the side surface of the filling pattern 122. The spacer film 124 may include, but not limited to, insulating materials, for example, at least one of silicon oxide, aluminum oxide, tantalum oxide, and combinations thereof. The spacer film 124 may be interposed between the filling pattern 122 and the first substrate 100 to electrically separate the filling pattern 122 and the first substrate 100.

A first transfer gate electrode 140A may be formed on the first side 100*a* of the first substrate 100. The first transfer gate electrode 140A may be formed on the first substrate 100 between the photoelectric conversion region 101 and the first floating diffusion region FD1. For example, the first transfer gate electrode 140A may be formed on the first channel region CH1 of the first active region AR1. For example, the first channel region CH1 may be defined inside the first active region AR1 below the first transfer gate electrode 140A.

When the first transfer gate electrode 140A is turned on, a channel may be formed inside the first channel region CH1 between the photoelectric conversion region 101 and the first floating diffusion region FD1. For example, the first transfer gate electrode 140A may form a channel of the second conductive type (e.g., n-type) inside the first channel region CH1.

The first transfer gate electrode 140A may correspond to the gate electrode of the transfer transistor (e.g., TG of FIG. 2). For example, when the first transfer gate electrode 140A is turned on, the electric charges generated from the photoelectric conversion region 101 may be transmitted to the first floating diffusion region FD1 through the first channel region CH1.

The first transfer gate electrode 140A may be or may include a vertical transfer gate. For example, at least a part of the first transfer gate electrode 140A may be embedded in the first substrate 100. For example, a substrate trench 100*t* that at least partially overlaps the first active region AR1 may be formed inside the first substrate 100. At least a part of the first transfer gate electrode 140A may be formed to fill such a substrate trench 100*t*. The substrate trench 100*t* may extend from the first side 100*a* of the first substrate 100. As a result, the lower surface of the first transfer gate electrode 140A may be formed to be lower than the first side 100*a* of the first substrate 100.

In some example embodiments, the width of the substrate trench 100*t* may decrease in a direction away from the first side 100*a* of the first substrate 100. This may be due to the characteristics of the etching process for forming the substrate trench 100*t*.

In some example embodiments, the substrate trench 100*t* may overlap both the first active region AR1 and the element separation pattern 110. For example, the substrate trench 100*t* may be a trench formed by patterning both the first substrate 100 including the first active region AR1 and the element separation pattern 110. In this case, as shown in FIGS. 4 and 5, a part of the side surface of the substrate trench 100*t* may be defined by the element separation pattern 110.

The first transfer gate electrode 140A may include, for example, but not limited to, at least one of an impurity-doped polysilicon (poly Si), a metal silicide such as cobalt silicide, a metal nitride such as titanium nitride, and a metal such as tungsten, copper and aluminum. As an example, the first transfer gate electrode 140A may include a polysilicon film.

The first transfer gate electrode 140A may include a lower gate 142 and an upper gate 144.

The lower gate 142 may fill a part of the substrate trench 100*t*. In some example embodiments, the upper surface of the lower gate 142 may be formed to be lower than the first side 100*a* of the first substrate 100. For example, the lower gate 142 may fill the lower part of the substrate trench 100*t*.

The upper gate 144 may be placed on the lower gate 142. The upper gate 144 may have a shape protruding from the upper surface of the lower gate 142. In some example embodiments, the upper surface of the upper gate 144 may be formed to be higher than the first side 100*a* of the first substrate 100. For example, the upper part of the upper gate 144 may protrude from the first side 100*a* of the first substrate 100.

In some example embodiments, a second width W2 of the upper gate 144 may be smaller than a first width W1 of the lower gate 142. Such lower gate 142 and upper gate 144 may be formed, for example, by patterning the upper part of the first transfer gate electrode 140A. For example, as shown in FIG. 5, a first gate trench 140*t*1 and a second gate trench 140*t*2 may be formed inside the upper part of the first transfer gate electrode 140A. The first gate trench 140*t*1 and the second gate trench 140*t*2 may be defined by the upper surface of the lower gate 142 and the side surface of the upper gate 144, respectively.

In some example embodiments, the first gate trench 140*t*1 may be defined between the upper gate 144 and the first floating diffusion region FD1. In some example embodiments, the second gate trench 140*t*2 may be defined between the upper gate 144 and the element separation pattern 110.

Although the depth of formation of the first gate trench 140*t*1 and the depth of formation of the second gate trench 140*t*2 are only shown as being equal to each other on the basis of the surface of the first substrate 100 (e.g., the first side 100*a*), this is merely an example. As another example, the depth of formation of the first gate trench 140*t*1 and the depth of formation of the second gate trench 140*t*2 may differ from each other; e.g., the depth of the first gate trench 140*t*1 may be greater than or less than the depth of the second gate trench 1402*t*2.

In some example embodiments, the first transfer gate electrode 140A may further include a residual gate film 146. Such a residual gate film 146 may be or may include, for example, a residual film that remains in the process of patterning the upper part of the first transfer gate electrode 140A. For example, as shown in FIG. 5, the first gate trench 140*t*1 may be defined by the upper surface of the lower gate 142, the side surface of the upper gate 144, and the side surface of the residual gate film 146.

In some example embodiments, the lower gate 142, the upper gate 144, and the residual gate film 146 may be formed integrally.

The gate dielectric film 130 may be interposed between the first transfer gate electrode 140A and the first substrate 100. For example, the gate dielectric film 130 may extend along profiles of the side surface and the lower surface of the substrate trench 100*t*. The first transfer gate electrode 140A is formed on the gate dielectric film 130 and may fill at least a part of the substrate trench 100*t*. In some example embodiments, the gate dielectric film 130 may not extend along the first side 100*a* of the first substrate 100.

The gate dielectric film 130 may include, for example, but not limited to, at least one of silicon oxide, silicon nitride, silicon oxynitride, and low dielectric constant (low-k) materials having a lower dielectric constant than silicon oxide. The low dielectric constant material may include, for example, at least one of FOX (Flowable Oxide), TOSZ (Torene SilaZene), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material, and combinations thereof. As an example, the gate dielectric film 130 may include a silicon oxide film.

The gate dielectric film 130 may include a lower dielectric film 132 and an upper dielectric film 134.

At least a part of the lower dielectric film 132 may be interposed between the first substrate 100 and the lower gate 142. For example, the lower dielectric film 132 may conformally extend along the profile of a part of the side surface and the lower surface of the substrate trench 100*t*.

The upper dielectric film 134 may extend from the upper part of the lower dielectric film 132. At least a part of the upper dielectric film 134 may be adjacent to the first floating diffusion region FD1. For example, at least a part of the upper dielectric film 134 may be interposed between the first floating diffusion region FD1 and the upper gate 144. In some example embodiments, at least a part of the upper dielectric film 134 may interposed between the first floating diffusion region FD1 and the residual gate film 146. For example, the residual gate film 146 may extend along the profile of the side surface of the upper dielectric film 134.

Although the residual gate film 146 is only shown to extend to the upper part of the upper dielectric film 134, this is merely an example. In some example embodiments, the residual gate film 146 may extend along the profile of a part (e.g., a lower part) of the side surface of the upper dielectric film 134. In this case, the other part (e.g., an upper part) of the side surface of the upper dielectric film 134 may be exposed from the residual gate film 146.

In some example embodiments, the upper dielectric film 134 may extend from the lower dielectric film 132 to the surface (e.g., the first side 100*a*) of the first substrate 100. For example, the upper surface of the upper dielectric film 134 may be exposed from the first side 100*a* of the first substrate 100.

In some example embodiments, the depth D2 of formation of the upper dielectric film 134 may be greater than the depth D1 of formation of the first floating diffusion region FD1 on the basis of the surface (e.g., the first side 100*a*) of the first substrate 100. As an example, the depth D2 of formation of the upper dielectric film 134 may be from about 0.1 Å to about 2000 Å (about 0.01 nm to about 200.0 nm), preferably from about 1 Å to about 1100 Å (about 0.1 nm to about 110.0 nm). In the above range, the upper dielectric film 134 is placed in an overlapping region between the first transfer gate electrode 140A and the first floating diffusion region FD1, and may effectively reduce the gate-induced drain leakage.

Although the depth of formation of the first gate trench 140*t*1 is only shown as being the same as the depth D2 of formation of the upper dielectric film 134, on the basis of the surface (e.g., the first side 100*a*) of the first substrate 100, this is merely an example. As another example, the depth of formation of the first gate trench 140*t*1 may differ from the depth D2 of formation of the upper dielectric film 134.

The upper dielectric film 134 may have an increased thickness as compared to the lower dielectric film 132. For example, as shown in FIGS. 5 to 7, the lower dielectric film 132 may have a first thickness T1, and the upper dielectric film 134 may have a second thickness T2 greater than the first thickness T1.

In some example embodiments, the second thickness T2 of the upper dielectric film 134 may increase in a direction going away from the lower dielectric film 132 or may increase and then be constant in the direction going away from the lower dielectric film 132.

In some example embodiments, as shown in FIG. 7, a boundary film 100*f* may be formed in the first substrate 100 adjacent to the upper dielectric film 134. The boundary film 100*f* may extend along the profile of the side surface of the upper dielectric film 134. The upper dielectric film 134 may be interposed between the residual gate film 146 and the boundary film 100*f*.

The boundary film 100*f* may be formed by implantation of impurity atoms into the first substrate 100 adjacent to the upper dielectric film 134. The impurity atom may contain, for example, fluorine (F). As an example, when the first substrate 100 is a silicon (Si) substrate, the boundary film 100*f* may include a silicon-fluorine (Si—F) bond. In some example embodiments, at least some fluorine atoms may be interstitial and at least some fluorine atoms may be bonded to silicon atoms; however, example embodiments are not limited thereto. An impurity concentration (e.g., fluorine concentration) of the boundary film 100*f* may be, for example, about 2E15 at/cm$^3$ to about 4E15 at/cm$^3$. In the above range, the upper dielectric film 134 is placed in the overlapping region between the first transfer gate electrode 140A and the first floating diffusion region FD1, and may effectively reduce the gate-induced drain leakage.

As the impurity atom is implanted into the first substrate 100 to form the boundary film 100*f*, the thickness of the gate dielectric film 130 adjacent to the boundary film 100*f* may increase. Accordingly, the gate dielectric film 130 including the above-mentioned upper dielectric film 134 may be formed. This will be described more specifically later in the description of FIG. 21.

The gate spacer 150 may be formed on the first transfer gate electrode 140A. The gate spacer 150 may be formed on the upper surface of the lower gate 142 and the side surface of the upper gate 144. For example, as shown in FIG. 5, the gate spacer 150 may fill at least a part of the first gate trench 140*t*1 and/or at least a part of the second gate trench 140*t*2.

The gate spacer 150 may include, for example, but not limited to, at least one of silicon oxide, silicon nitride, silicon oxynitride, and combinations thereof. In an example, the gate spacer 150 may include a silicon nitride film.

The gate spacer 150 formed inside the first gate trench 140*t*1 may be interposed between the upper gate 144 and the upper dielectric film 134. For example, the upper gate 144 may be spaced apart from the upper dielectric film 134 by the gate spacer 150. In some example embodiments, the upper gate 144 may be spaced apart from the residual gate film 146 by the gate spacer 150.

The gate spacer 150 formed inside the second gate trench 140*t*2 may be interposed between the upper gate 144 and the element separation pattern 110. For example, the upper gate 144 may be spaced apart from the element separation pattern 110 by the gate spacer 150. In some example embodiments, a part of the second gate trench 140*t*2 may be defined inside a part of the element separation pattern 110. In this case, a part of the gate spacer 150 may overlap a part of the element separation pattern 110.

In some example embodiments, a first operating gate electrode G1 may be formed on the first side 100*a* of the first substrate 100. For example, as shown in FIG. 3, the first operating gate electrode G1 may be formed on the second channel region CH2 of the third active region AR3. For example, the second channel region CH2 may be defined inside the third active region AR3 below the first operating gate electrode G1. The first source/drain regions SD1 may be defined inside the third active region AR3 adjacent to both sides of the first operating gate electrode G1.

When the first transfer gate electrode 140A is turned on, a channel may be formed inside the second channel region CH2 between the first source/drain regions SD1. For example, the first transfer gate electrode 140A may form a channel of the second conductive type (e.g., n-type) inside the second channel region CH2.

In some example embodiments, the first operating gate electrode G1 may be or may include a planar gate. For example, the lower surface of the first operating gate electrode G1 may extend along the first side 100*a* of the first substrate 100.

In some example embodiments, the first operating gate electrode G1 may correspond to one of a gate electrode of a reset transistor (e.g., RG of FIG. 2), a gate electrode of a source follower transistor (e.g., SF of FIG. 2), and a gate electrode of a selection transistor (e.g., SEL of FIG. 2).

Although only an example in which one first operating gate electrode G1 is placed in the first unit pixel UP1 is shown, this is merely an example, and a plurality of operating gate electrodes having different functions from each other may be placed inside the first unit pixel UP1. For example, at least two gate electrodes among the gate electrode of the reset transistor (e.g., RG of FIG. 2), the gate electrode of the source follower transistor (e.g., SF of FIG. 2), and the gate electrode of the selection transistor (e.g., SEL of FIG. 2) may be placed inside the first unit pixel UP1.

The first wiring structure 160 may be formed on the first side 100*a* of the first substrate 100. The first wiring structure 160 may include a plurality of wiring patterns. For example, the first wiring structure 160 may include a first inter-wiring insulating film 162 on the first side 100*a*, and a first wiring pattern 164 inside the first inter-wiring insulating film 162. In FIG. 4, one or more of the number of layers, the placement, and the like of the first wiring pattern 164 are merely example, and are not limited thereto.

The first wiring structure 160 may be electrically connected to the first transfer gate electrode 140A and/or the first operating gate electrode G1. For example, gate contacts 165*a* and 165*b* for connecting the first transfer gate electrode 140A or the first operating gate electrode G1 and the first wiring pattern 164 may be formed inside the first inter-wiring insulating film 162.

Further, the first wiring structure 160 may be electrically connected to the active regions (e.g., the first to third active regions AR1 to AR3). For example, source/drain contacts 167*a* to 167*d* which connect the first impurity region 102 or the second impurity region 103 and the first wiring pattern 164 may be formed inside the first inter-wiring insulating film 162.

The surface insulating film 170 may be formed on the second side 100*b* of the first substrate 100. The surface insulating film 170 may extend along the second side 100*b* of the first substrate 100. The surface insulating film 170 may include, but not limited to, an insulating material, for example, at least one of silicon oxide, silicon nitride, silicon oxynitride, aluminum oxide, or hafnium oxide.

In some example embodiments, the surface insulating film 170 may be formed of a multiple film. For example, unlike that shown, the surface insulating film 170 may include an aluminum oxide film, a hafnium oxide film, a silicon oxide film, a silicon nitride film, and a hafnium oxide film that are sequentially stacked on the second side 100*b* of the first substrate 100.

The surface insulating film 170 may function as an antireflection film to prevent or reduce reflection of light that is incident on the second side 100*b* of the first substrate 100. Therefore, the photo-receiving rate of the photoelectric conversion region 101 may be improved. Further, the surface insulating film 170 may function as a flattening film to contribute to the formation of a color filter 180 and a microlens 190, which will be described later, at a uniform height.

The color filter 180 may be formed on the surface insulating film 170. The color filter 180 may be arranged to correspond to each unit pixel (e.g., the first unit pixel UP1). For example, the plurality of color filters 180 may be arranged two-dimensionally (e.g., in the form of a matrix) in a plane including the first direction X and the second direction Y.

The color filter 180 may have various colors depending on the unit pixels. For example, the color filter 180 may include a red color filter, a green color filter, a blue color filter, a yellow filter, a magenta filter, and a cyan filter, and may further include a white filter.

In some example embodiments, grid patterns 172 and 174 may be formed on the surface insulating film 170. The grid patterns 172 and 174 are formed in a grid pattern from a planar viewpoint and may be interposed between the color filters 180. In some example embodiments, the grid patterns 172 and 174 may be placed to overlap the pixel separation pattern 120.

In some example embodiments, the grid patterns 172 and 174 may include a metal pattern 172 and a low refractive index pattern 174. The metal pattern 172 and the low refractive index pattern 174 may be sequentially stacked on, for example, the surface insulating film 170.

The metal pattern 172 may include, for example, but not limited to, at least one of titanium (Ti), titanium nitride (TiN), tantalum (Ta), tantalum nitride (TaN), tungsten (W), aluminum (Al), copper (Cu), and a combination thereof. The metal pattern 172 may prevent or reduce the electric charges generated by ESD or the like from accumulating on the surface of the first substrate 100 (e.g., the second side 110b) to effectively prevent or reduce an ESD bruise defect.

The low refractive index pattern 174 may include a low refractive index material having a lower refractive index than silicon (Si). For example, the low refractive index pattern 174 may include, but not limited to, at least one of silicon oxide, aluminum oxide, tantalum oxide, and combinations thereof. The low refractive index pattern 174 may improve the light collection efficiency by refracting or reflecting the obliquely incident light.

In some example embodiments, a first protective film 176 may be formed on the surface insulating film 170 and the grid patterns 172 and 174. For example, the first protective film 176 may conformally extend along the profiles of the surface insulating film 170, and the grid patterns 172 and 174. The first protective film 176 may include, for example, but not limited to, aluminum oxide. The first protective film 176 may prevent or reduce damage to the surface insulating film 170 and the grid patterns 172 and 174.

The microlens 190 may be formed on the color filter 180. The microlens 190 may be arranged to correspond to each unit pixel (e.g., the first unit pixel UP1). For example, the plurality of microlenses 190 may be arranged two-dimensionally (e.g., in the form of a matrix) in the plane including the first direction X and the second direction Y.

The microlens 190 has a convex shape and may have a dynamically determined or predetermined radius of curvature. Accordingly, the microlens 190 may collect the light incident on the photoelectric conversion region 101. The microlens 190 may include, for example, but not limited to, a light transmissive resin.

In some example embodiments, a second protective film 195 may be formed on the microlens 190. The second protective film 195 may extend along the surface of the microlens 190. The second protective film 195 may include, for example, an inorganic oxide film. For example, the second protective film 195 may include, but not limited to, at least one of silicon oxide, titanium oxide, zirconium oxide, hafnium oxide, and combinations thereof. In some example embodiments, the second protective film 195 may include a low temperature oxide (LTO).

Such a second protective film 195 may protect the microlens 190 from the outside. For example, the second protective film 195 may protect the microlens 190 including an organic substance, by including an inorganic oxide film. Further, the second protective film 195 may improve the quality of the image sensor, by improving the light collection efficiency of the microlens 190. For example, the second protective film 195 may reduce reflection, refraction, scattering, and the like of incident light that reaches the space between the microlenses 190, by filling the space between the microlenses 190.

When the gate electrode and the drain region are placed adjacent to each other, direct tunneling may occur by strong electric field generated between them, and accompanying leakage current is called a gate-induced drain leakage (GIDL). As image sensors with miniaturized unit pixels are required for miniaturization of electronic devices and improvement in quality of image sensor, the influence of leakage currents such as gate-induced drain leakage gradually increasing.

In particular, in an image sensor that uses a vertical transfer gate, it may be important to control the gate-induced drain leakage due to the overlapping region between the vertical transfer gate and the floating diffusion region. In order to reduce such gate-induced drain leakage, the gate electrode of the vertical transfer gate may be patterned to separate the upper part of the gate electrode (e.g., the upper gate 144) from the floating diffusion region. However, residual material (e.g., the residual gate film 146) that remains in the process of patterning the gate electrode is still responsible for causing gate-induced drain leakage.

Because the image sensor according to various example embodiments has a structure in which the thickness of the gate dielectric film 130 adjacent to the residual gate film 146 selectively increases, the gate-induced drain leakage described above can be reduced. Specifically, as described above, the upper dielectric film 134 of the gate dielectric film 130 adjacent to the residual gate film 146 may have a thicker thickness than the lower dielectric film 132. Such an upper dielectric film 134 is placed in the overlapping region between the residual gate film 146 and the first floating diffusion region FD1, and the gate-induced drain leakage due to the residual gate film 146 can be more effectively reduced.

FIGS. 8 to 11 are various schematic cross-sectional views for explaining an image sensor according to some example embodiments. For convenience of explanation, repeated parts of contents explained using FIGS. 1 to 7 will be briefly described or omitted.

Figure 8:
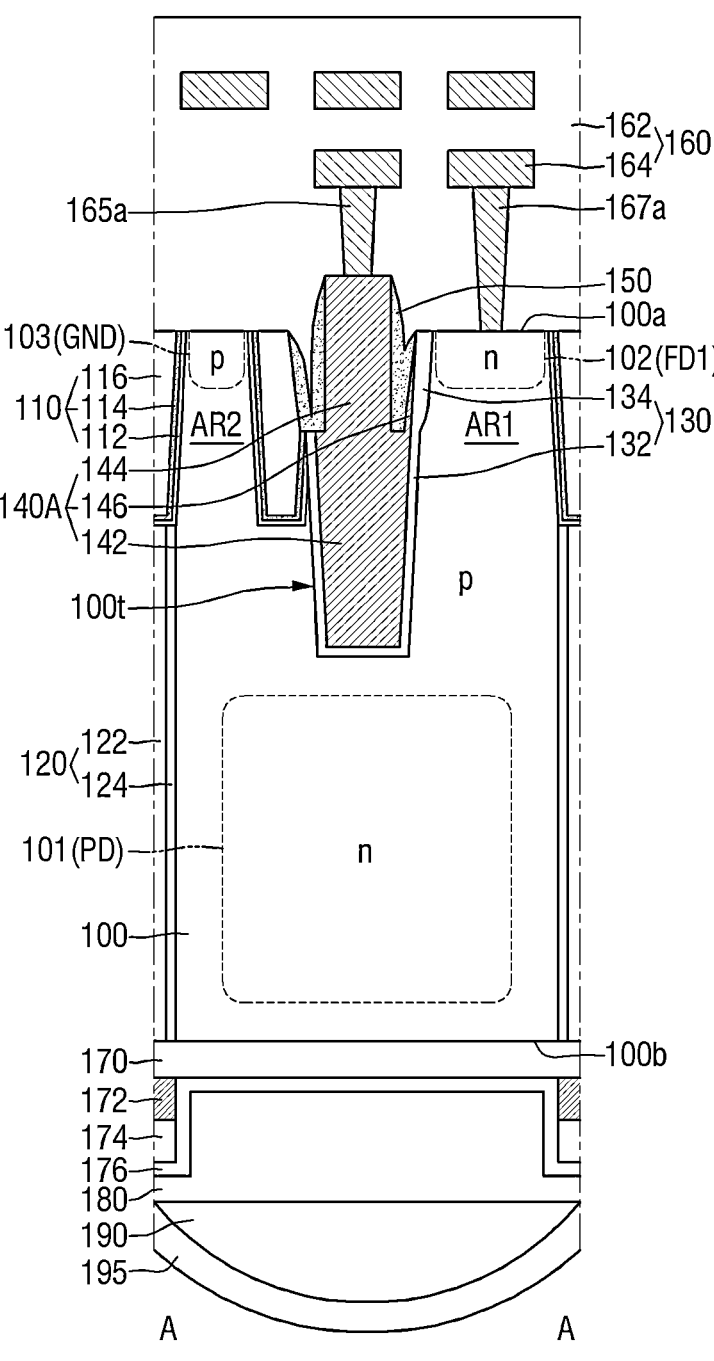
FIGS. 8 to 11 are various schematic cross-sectional views for explaining an image sensor according to some example embodiments.

Referring to FIG. 8, in the image sensor according to some example embodiments, the element separation pattern 110 is formed of a multiple film.

For example, the element separation pattern 110 may include an insulating liner 112, an etching blocking liner 114, and a gap fill insulating film 116 that are sequentially stacked on the first substrate 100. The insulating liner 112 may conformally extend along profiles of the side surface and the lower surface of a shallow trench formed by patterning the first substrate 100. The etching blocking liner 114 may be formed on the insulating liner 112. The etching blocking liner 114 may conformally extend along the profile of the insulating liner 112. The gap fill insulating film 116 may be formed on the etching blocking liner 114. The gap fill insulating film 116 may fill the region of the shallow trench which remains after formation of the insulating liner 112 and the etching blocking liner 114.

The insulating liner 112, the etching blocking liner 114, and the gap fill insulating film 116 may include, for example, but not limited to, at least one of silicon oxide, silicon nitride, silicon oxynitride, and a combination thereof.

In some example embodiments, the etching blocking liner 114 may include a material having an etching selectivity with respect to the insulating liner 112 and the gap fill insulating film 116. For example, when the insulating liner 112 and the gap fill insulating film 116 include silicon oxide, the etching blocking liner 114 may include at least one of silicon nitride, silicon carbonitride, silicon oxycarbonitride and combinations thereof. As an example, the insulating liner 112 and the gap fill insulating film 116 may include a silicon oxide film, and the etching blocking liner 114 may include a silicon nitride film.

Figure 9:
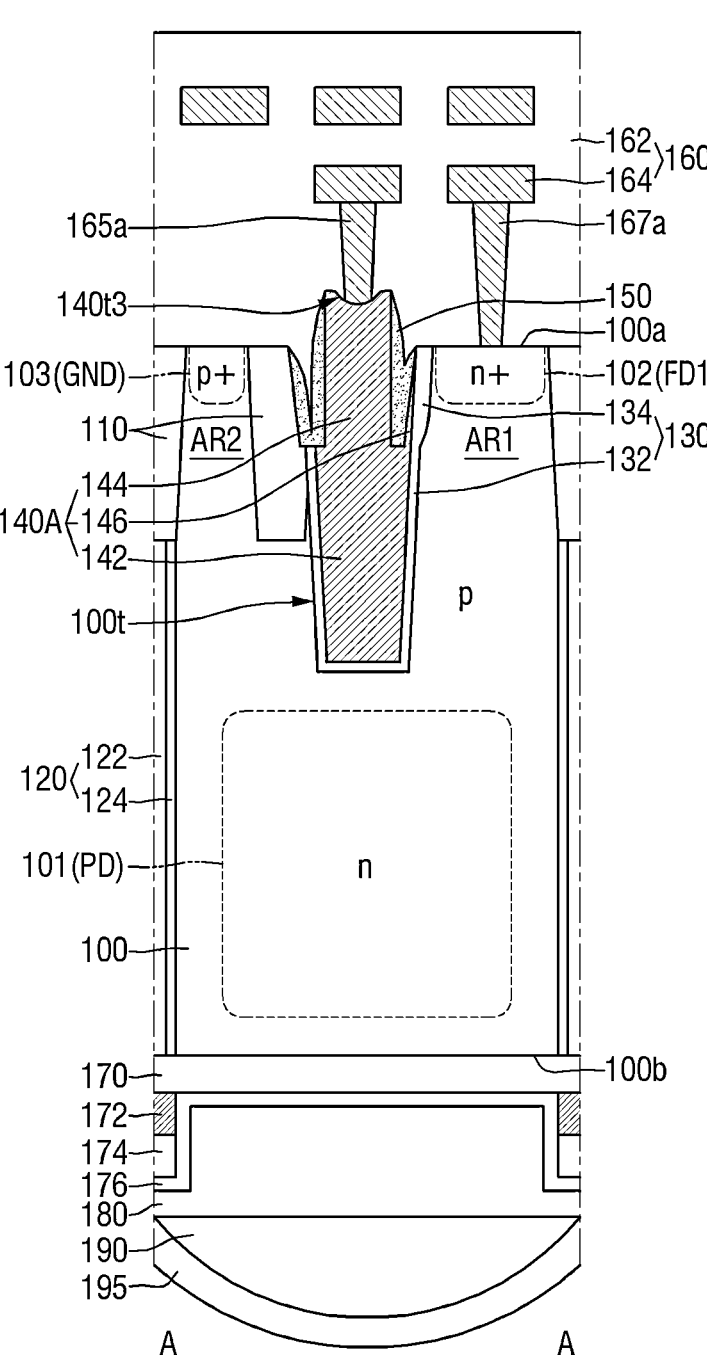

Referring to FIG. 9, in the image sensor according to some example embodiments, the first transfer gate electrode 140A includes a concave surface 140t3.

The concave surface 140t3 may be formed on the upper surface of the upper gate 144. The concave surface 140t3 may have a concave shape toward the first substrate 100. This may be due to the characteristics of a vapor deposition process for forming the first transfer gate electrode 140A.

For example, in the process of forming the first transfer gate electrode 140A, an electrode film (e.g., a preliminary electrode film 140L of FIG. 22) that fills the substrate trench 100t may form the concave surface 140t3.

Figure 10:
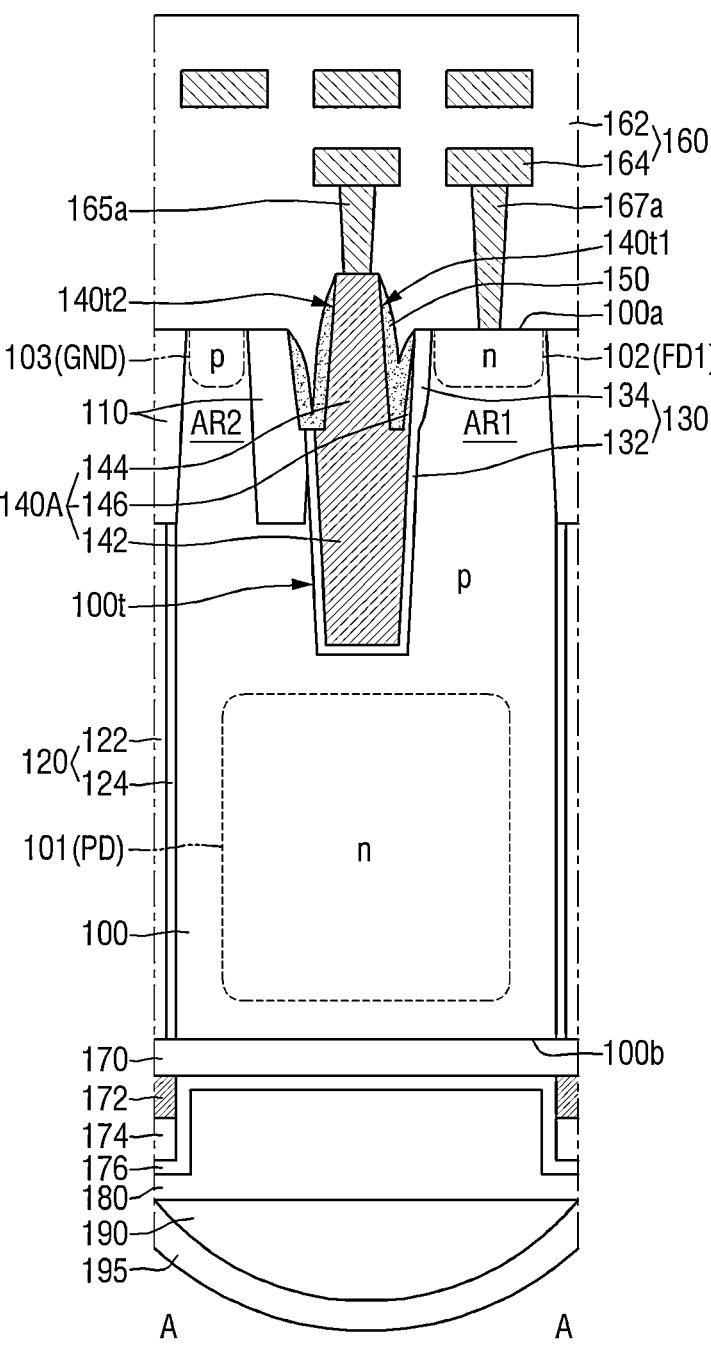

Referring to FIG. 10, in the image sensor according to some example embodiments, the width of the upper gate 144 decreases as it goes away from the lower gate 142.

For example, the width of the first gate trench 140t1 and/or the width of the second gate trench 140t2 may decrease toward the lower gate 142. This may be due to the characteristics of an etching process for forming the first gate trench 140t1 and/or the second gate trench 140t2.

Figure 11:
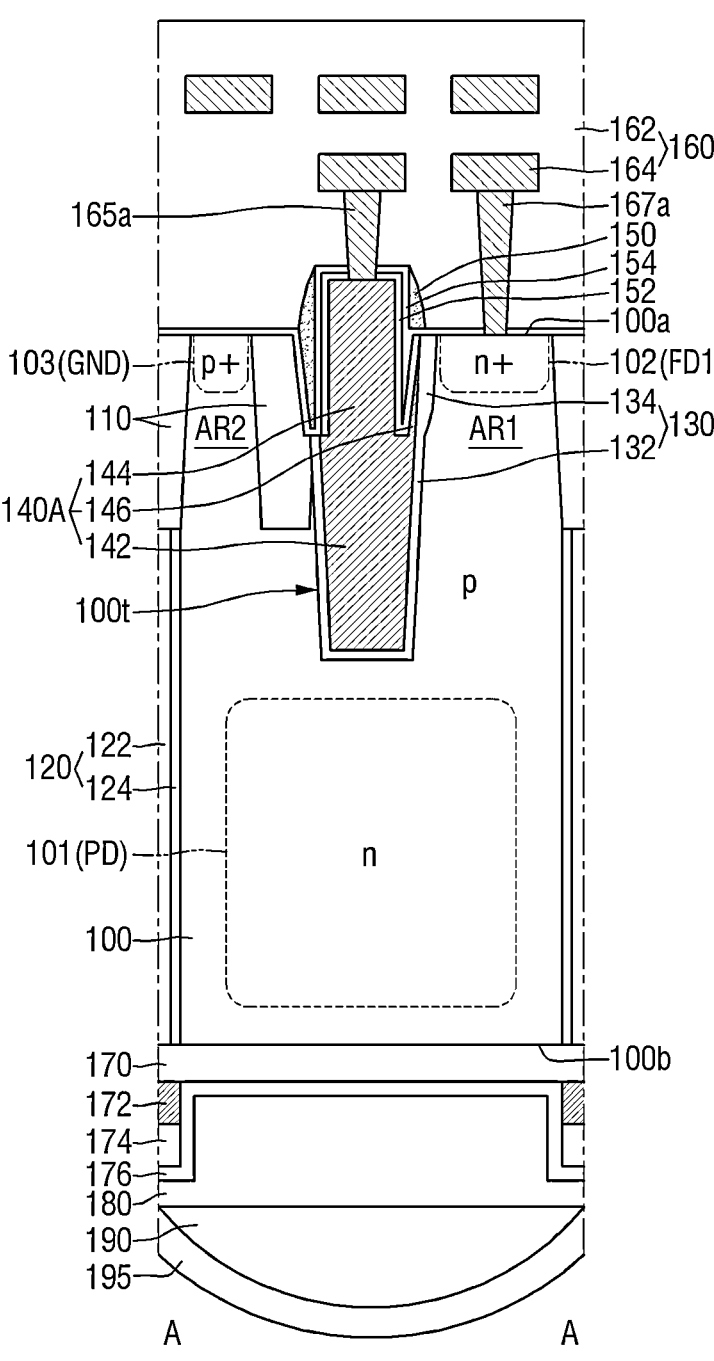

Referring to FIG. 11, the image sensor according to some example embodiments further includes a first insulating film 152 and a second insulating film 154.

The first insulating film 152 may extend along the surface of the first transfer gate electrode 140A. For example, the first insulating film 152 may conformally extend along the upper surface of the lower gate 142, the side surfaces and upper surface of the upper gate 144, and the side surfaces of the residual gate film 146. In some example embodiments, the first insulating film 152 may be an oxide film formed by oxidizing the surface of the first transfer gate electrode 140A. As an example, when the first transfer gate electrode 140A includes polysilicon, the first insulating film 152 may include a silicon oxide film.

The second insulating film 154 may be formed on the first insulating film 152. For example, the second insulating film 154 may conformally extend along the surface of the first insulating film 152, the surface of the first substrate 100, and the surface of the element separation pattern 110. The second insulating film 154 may include, for example, but not limited to, at least one of silicon oxide, silicon nitride, silicon oxynitride, and a low dielectric constant (low-k) material having a lower dielectric constant than silicon oxide. As an example, the second insulating film 154 may include USG (Undoped Silicate Glass).

In some example embodiments, the gate contacts 165a and 165b may penetrate the first insulating film 152 and the second insulating film 154, and be connected to the first transfer gate electrode 140A or the first operating gate electrode G1.

In some example embodiments, the source/drain contacts 167a to 167d may penetrate the second insulating film 154, and be connected to the first impurity region 102 or the second impurity region 103.

Figure 12:
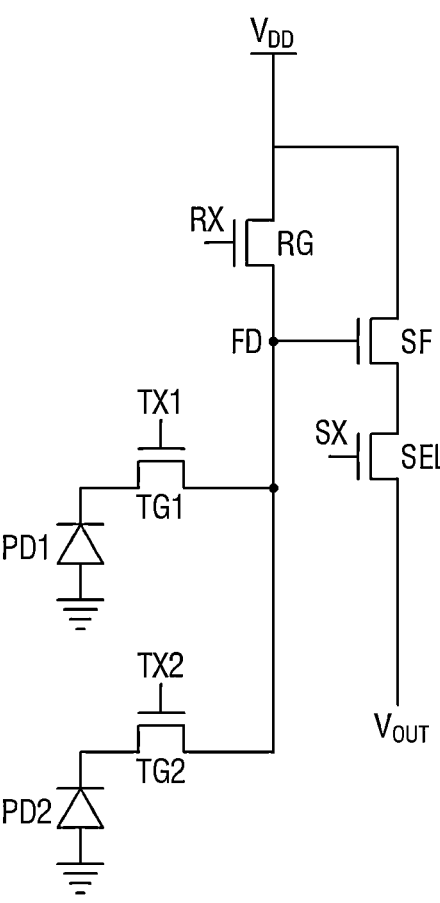
FIG. 12 is an example circuit diagram for explaining an image sensor according to some example embodiments.
Figure 13:
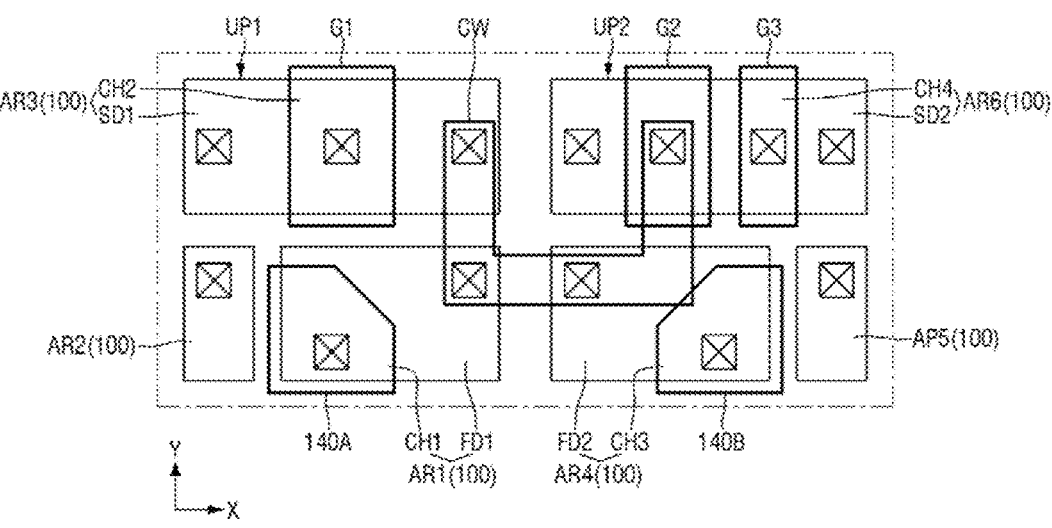
FIGS. 13 and 14 are various schematic layout diagrams for explaining an image sensor according to some example embodiments.
Figure 14:
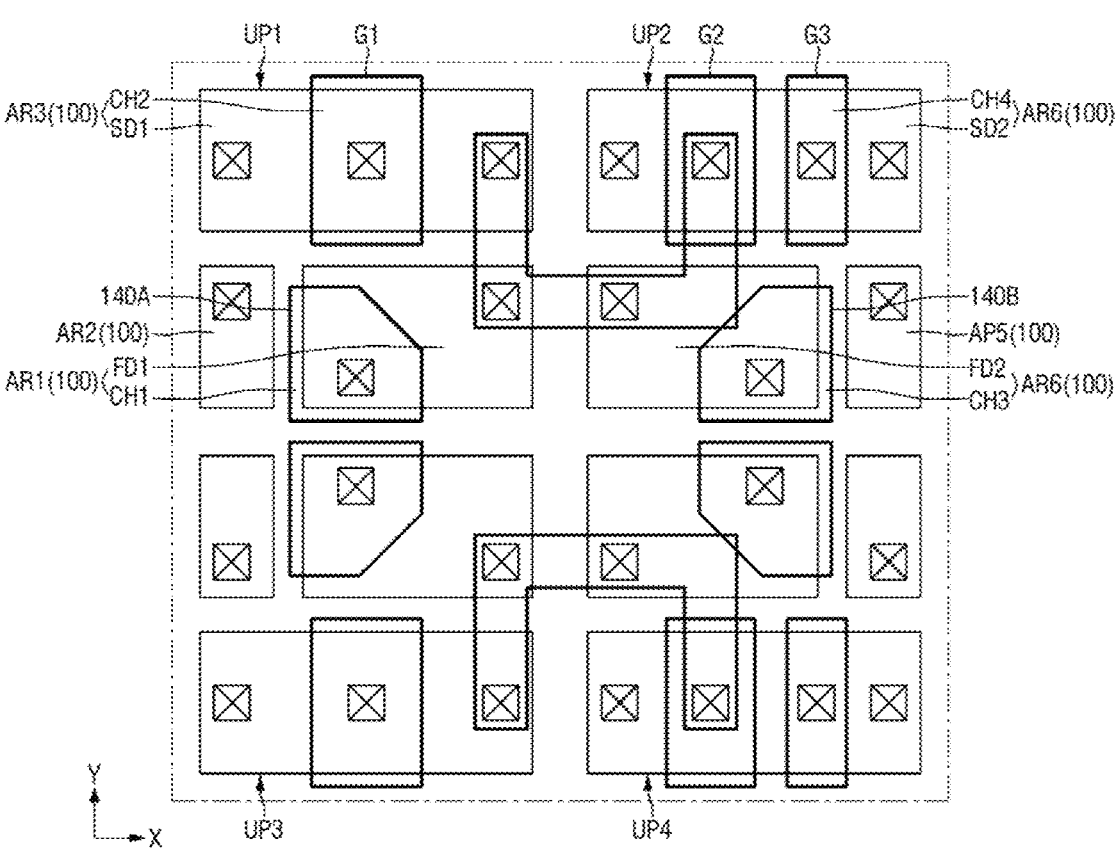

FIG. 12 is an example circuit diagram for explaining an image sensor according to some example embodiments. FIGS. 13 and 14 are various schematic layout diagrams for explaining an image sensor according to some example embodiments.

Referring to FIG. 12, the image sensor according to some example embodiments may include a first photoelectric conversion element PD1 and a second photoelectric conversion element PD2 that share the floating diffusion region FD.

The first photoelectric conversion element PD1 and the second photoelectric conversion element PD2 may generate electric charges in proportion to the amount of light that is incident from the outside, respectively. The first photoelectric conversion element PD1 may be coupled to the first transfer transistor TG1 that transfers the generated and accumulated electric charges to the floating diffusion region FD. The second photoelectric conversion element PD2 may be coupled to the second transfer transistor TG2 that transfers the generated and accumulated electric charges to the floating diffusion region FD.

One end of the first transfer transistor TG1 may be connected to the first photoelectric conversion element PD1, and the other end of the first transfer transistor TG1 may be connected to the floating diffusion region FD. The first transfer transistor TG1 may be formed of a transistor driven by a dynamically determined or predetermined bias (e.g., the first transfer signal TX1). One end of the second transfer transistor TG2 may be connected to the second photoelectric conversion element PD2, and the other end of the second transfer transistor TG2 may be connected to the floating diffusion region FD. The second transfer transistor TG2 may be formed of a transistor driven by a dynamically determined or predetermined bias (e.g., the second transfer signal TX2).

Referring to FIG. 13, an image sensor according to some example embodiments includes a first unit pixel UP1 and a second unit pixel UP2 that are adjacent to each other.

For example, the first unit pixel UP1 and the second unit pixel UP2 may be arranged adjacent to each other in the first direction X. The first unit pixel UP1 and the second unit pixel UP2 may be defined by the element separation pattern 110, respectively. For example, the element separation pattern 110 may surround each of the first unit pixel UP1 and the second unit pixel UP2.

In the first unit pixel UP1, the above-mentioned first to third active regions AR1 to AR3, the first transfer gate electrode 140A, and the first operating gate electrode G1 explained above using FIGS. 3 to 7 may be formed. Therefore, a detailed description of the first unit pixel UP1 will not be provided.

In the second unit pixel UP2, fourth to sixth active regions AR4 to AR6, a second transfer gate electrode 140B, a second operating gate electrode G2, and a third operating gate electrode G3 may be formed.

A fourth active region AR4 may include a second floating diffusion region FD2 and a third channel region CH3. Since the fourth active region AR4 may be similar to the first active region AR1 except that it is formed in the second unit pixel UP2, detailed description thereof will not be provided below.

A fifth active region AR5 may be spaced apart from the first active region AR1 by the element separation pattern 110. In some example embodiments, the fifth active region AR5 may include a ground region to which a ground voltage is applied. Since the fifth active region AR5 may be similar to the second active region AR2 except that it is formed in the second unit pixel UP2, the detailed description thereof will not be provided below.

A sixth active region AR6 may be spaced apart from the fourth active region AR4 and the fifth active region AR5 by the element separation pattern 110. In some example embodiments, the sixth active region AR6 may include second source/drain regions SD2 and a fourth channel region CH4. Since the sixth active region AR6 may be similar to the third active region AR3 except that it is formed in the second unit pixel UP2, the detailed description thereof will not be provided below.

In some example embodiments, as shown, the first to third active regions AR1 to AR3 and the fourth to sixth active regions AR4 to AR6 may be formed symmetrically with respect to the plane that crosses the first unit pixel UP1 and the second unit pixel UP2.

The second transfer gate electrode 140B may be formed on the third channel region CH3 of the fourth active region AR4. Since the second transfer gate electrode 140B may be similar to the first transfer gate electrode 140A except that it is formed on the second unit pixel UP2, the detailed description thereof will not be provided below.

In some example embodiments, as shown, the first transfer gate electrode 140A and the second transfer gate electrode 140B may be formed symmetrically with respect to the plane that crosses the first unit pixel UP1 and the second unit pixel UP2.

The first transfer gate electrode 140A may correspond to the gate electrode of the first transfer transistor (e.g., TG1 of FIG. 12), and the second transfer gate electrode 140B may correspond to the gate electrode of the second transfer transistor (e.g., TG2 of FIG. 12).

In some example embodiments, the first floating diffusion region FD1 and the second floating diffusion region FD2 may be electrically connected. For example, as shown, a connecting wiring CW that connects the first floating diffusion region FD1 and the second floating diffusion region FD2 may be formed. Accordingly, the first unit pixel UP1 and the second unit pixel UP2 may share the floating diffusion region (e.g., FD of FIG. 6).

The second operating gate electrode G2 and the third operating gate electrode G3 may be formed on the fourth channel region CH4 of the sixth active region AR6, respectively. That is, the fourth channel region CH4 may be defined inside the sixth active region AR6 below the second operating gate electrode G2 and the third operating gate electrode G3. The second source/drain regions SD2 may be defined inside the sixth active region AR6 adjacent to both side surfaces of the second operating gate electrode G2 and both side surfaces of the third operating gate electrode G3.

In some example embodiments, the first operating gate electrode G1 may correspond to the gate electrode of a reset transistor (e.g., RG of FIG. 12). For example, the connecting wiring CW may connect the first floating diffusion region FD1 and the second floating diffusion region FD2 to the first source/drain region SD1. As a result, the first operating gate electrode G1 may periodically reset the first floating diffusion region FD1 and the second floating diffusion region FD2.

In some example embodiments, the second operating gate electrode G2 may correspond to the gate electrode of a source follower transistor (e.g., SF of FIG. 12). For example, the connecting wiring CW may connect the first floating diffusion region FD1 and the second floating diffusion region FD2 to the second operating gate electrode G2. The second operating gate electrode G2 may amplify changes in electrical potentials of the first floating diffusion region FD1 and the second floating diffusion region FD2, and output this to the output line (e.g., VOUT of FIG. 12).

In some example embodiments, the third operating gate electrode G3 may correspond to the gate electrode of the selection transistor (e.g., SEL of FIG. 12).

Referring to FIG. 14, an image sensor according to some example embodiments includes first to fourth unit pixels UP1 to UP4 adjacent to each other.

For example, the first unit pixel UP1 and the second unit pixel UP2 may be arranged adjacent to each other in the first direction X. A third unit pixel UP3 and a fourth unit pixel UP4 may be arranged adjacent to each other in the first direction X. Further, the first unit pixel UP1 and the third unit pixel UP2 may be arranged adjacent to each other in the second direction Y, and the second unit pixel UP2 and the fourth unit pixel UP4 may be arranged adjacent to each other in the second direction Y. The first to fourth unit pixels UP1 to UP4 may be defined by the element separation pattern 110, respectively. For example, the element separation pattern 110 may surround each of the first to fourth unit pixels UP1 to UP4.

Since the first unit pixel UP1 and the second unit pixel UP2 are the same as those described above using FIG. 13, the detailed description thereof will not be provided below.

The third unit pixel UP3 may be similar to the first unit pixel UP1. In some example embodiments, as shown, the first unit pixel UP1 and the third unit pixel UP3 may be formed symmetrically with respect to a plane that crosses them.

The fourth unit pixel UP4 may be similar to the second unit pixel UP2. In some example embodiments, as shown, the second unit pixel UP2 and the fourth unit pixel UP4 may be formed symmetrically with respect to a plane that crosses them.

Figure 15:
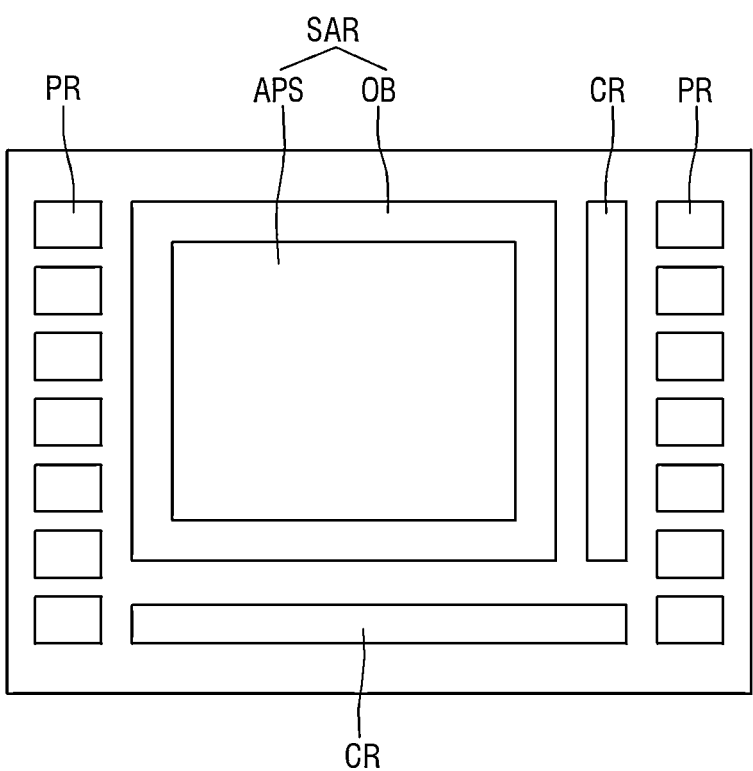
FIG. 15 is an example layout diagram for explaining an image sensor according to some example embodiments.
Figure 16:
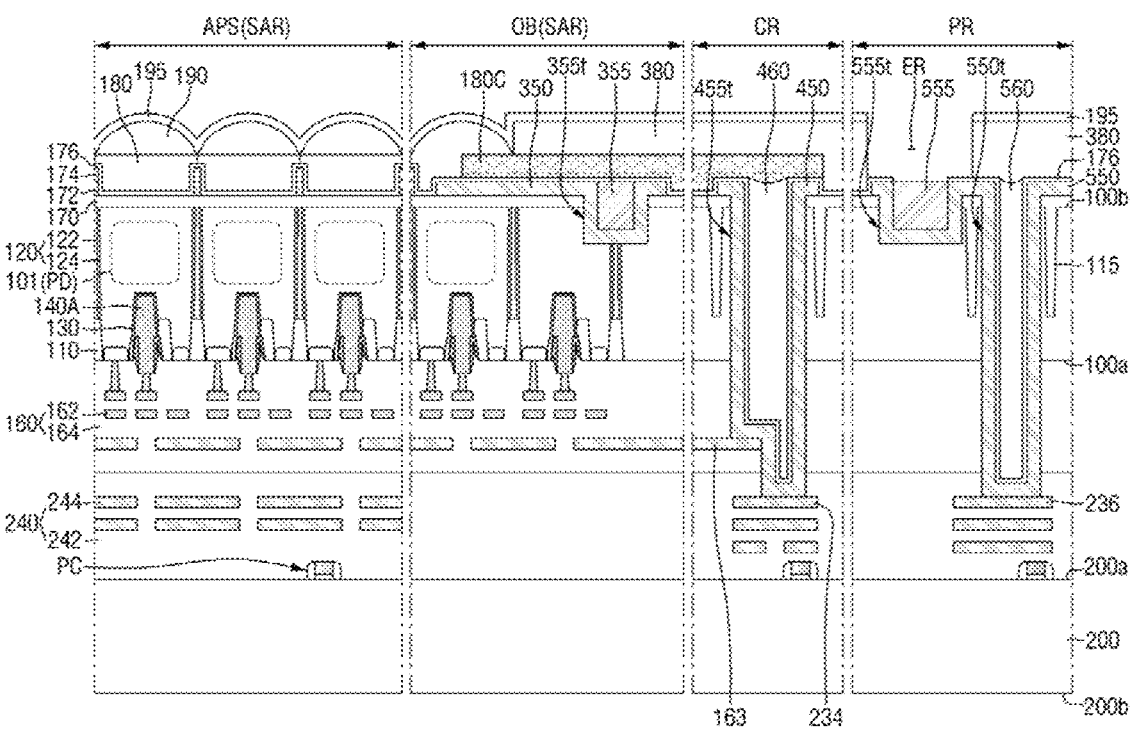
FIG. 16 is a schematic cross-sectional view for explaining the image sensor of FIG. 15.

FIG. 15 is an example layout diagram for explaining an image sensor according to some example embodiments. FIG. 16 is a schematic cross-sectional view for explaining the image sensor of FIG. 15. For convenience of explanation, repeated parts of contents explained using FIGS. 1 to 14 will be briefly described or omitted.

Referring to FIGS. 15 and 16, the image sensor according to some example embodiments includes a sensor array region SAR, a connecting region CR, and a pad region PR.

The sensor array region SAR may include a region corresponding to the active pixel sensor array 1 of FIG. 1. For example, a plurality of unit pixels arranged two-dimensionally (e.g., in the form of a matrix) may be formed inside the sensor array region SAR.

The sensor array region SAR may include a photo-receiving region APS and a photo-shielding region OB. Active pixels that receive light to generate an active signal may be arranged in the photo-receiving region APS. Optical black pixels that shield the light and generate an optical black signal may be arranged in the photo-shielding region OB. Although the photo-shielding region OB may be formed, for example, along the periphery of the photo-receiving region APS, this is only an example, and example embodiments are not limited thereto.

In some example embodiments, the photoelectric conversion region 101 may not be formed in a part of the photo-shielding region OB. For example, the photoelectric conversion region 101 may be formed in the first substrate 100 of the photo-shielding region OB adjacent to the photo-receiving region APS, but may not be formed in the first substrate 100 of the photo-shielding region OB separated from the photo-receiving region APS.

In some example embodiments, dummy pixels (not shown) may be formed in the photo-receiving region APS that is adjacent to the photo-shielding region OB.

The connecting region CR may be formed around the sensor array region SAR.

Although the connecting region CR may be formed on one side of the sensor array region SAR, this is merely an example. Wirings are formed in the connecting region CR, and may be configured to transmit and receive electrical signals of the sensor array region SAR.

The pad region PR may be formed around the sensor array region SAR. Although the pad region PR may be formed to be adjacent to the edge of the image sensor according to some example embodiments, this is merely an example. The pad region PR is connected to an external device or the like, and may be configured to transmit and receive electrical signals between the image sensor according to some example embodiments and the external device.

Although the connecting region CR is shown as being interposed between the sensor array region SAR and the pad region PR, this is merely an example. The placement of the sensor array region SAR, the connecting region CR and the pad region PR may be various as needed.

The first wiring structure 160 may include a first wiring pattern 164 in the sensor array region SAR and a second wiring pattern 163 in the connecting region CR. The first wiring pattern 164 may be electrically connected to the unit pixels of the sensor array region SAR. At least a part of the second wiring pattern 163 may be electrically connected to at least a part of the first wiring pattern 164. Accordingly, the second wiring pattern 163 may be electrically connected to the unit pixels of the sensor array region SAR.

The image sensor according to some example embodiments may include a second substrate 200 and a second wiring structure 240.

The second substrate 200 may be bulk silicon or SOI (silicon-on-insulator). The second substrate 200 may be or may include a silicon substrate or may include other substances, for example, silicon germanium, indium antimonide, lead tellurium compounds, indium arsenic, indium phosphide, gallium arsenide or gallium antimonide. Alternatively or additionally, the second substrate 200 may be or may include an epitaxial layer formed on a base substrate.

The second substrate 200 may include a third side 200a and a fourth side 200b that are opposite to each other. The third side 200a of the second substrate 200 may be opposite to the first side 100a of the first substrate 100.

A peripheral circuit element PC may be formed on the third side 200a of the second substrate 200. The peripheral circuit element PC may be electrically connected to the sensor array region SAR, and transmit and receive electrical signals to and from each unit pixel of the sensor array region SAR. For example, the peripheral circuit element PC may include electronic elements that constitute the row decoder 2, the row driver 3, the column decoder 4, the timing generator 5, the correlated double sampler 6, the analog-to-digital converter 7 or the I/O buffer 8 of FIG. 1.

The second wiring structure 240 may be formed on the third side 200a of the second substrate 200. For example, the second wiring structure 240 may include a second inter-wiring insulating film 242, and various wiring patterns 244, 234, and 236 inside the second inter-wiring insulating film 242. In FIG. 9, the number of layers and the placement of the wiring patterns 244, 234, and 236 are merely examples, and are not limited thereto.

At least a part of the wiring patterns 244, 234, and 236 of the second wiring structure 240 may be connected to the peripheral circuit element PC. In some example embodiments, the second wiring structure 240 may include a third wiring pattern 244 in the sensor array region SAR, a fourth wiring pattern 234 in the connecting region CR, and a fifth wiring pattern 236 in the pad region PR. In some example embodiments, the fourth wiring pattern 234 may be the uppermost wiring among the plurality of wirings in the connecting region CR, and the fifth wiring pattern 236 may be the uppermost wiring among the plurality of wirings in the pad region PR.

The first wiring structure 160 and the second wiring structure 240 may be bonded to each other. For example, as shown in FIG. 16, the upper surface of the second wiring structure 240 may be attached to a lower surface of the first wiring structure 160. The first wiring structure 160 and the second wiring structure 240 may be bonded, for example, but not limited to, by a wafer bonding process.

The image sensor according to some example embodiments may include a first connecting structure 350, a second connecting structure 450, and a third connecting structure 550.

The first connecting structure 350 may be formed inside the photo-shielding region OB. The first connecting structure 350 may be formed on the surface insulating film 170 of the photo-shielding region OB. The first connecting structure 350 may come into contact with a part of the pixel separation pattern 120. For example, a first trench 355t that exposes the pixel separation pattern 120 may be formed in the first substrate 100 and the surface insulating film 170 of the photo-shielding region OB. The first connecting structure 350 may be formed inside the first trench 355t and be in contact with the pixel separation pattern 120 inside the photo-shielding region OB. In some example embodiments, the first connecting structure 350 may extend along profiles of the side surfaces and the lower surface of the first trench 355t.

The first connecting structure 350 may include, for example, but not limited to, at least one of titanium (Ti), titanium nitride (TiN), tantalum (Ta), tantalum nitride (TaN), tungsten (W), aluminum (Al), copper (Cu) and a combination thereof.

In some example embodiments, the first connecting structure 350 may be electrically connected to the pixel separation pattern 120 and apply a ground voltage or a negative voltage to the pixel separation pattern 120. As a result, the electric charges generated by ESD or the like may be discharged to the first connecting structure 350 through the pixel separation pattern 120. The ESD bruise defect may be effectively prevented or reduced accordingly.

In some example embodiments, a first pad 355 that fills the first trench 355t may be formed on the first connecting structure 350. The first pad 355 may include, for example, but not limited to, at least one of tungsten (W), copper (Cu), aluminum (Al), gold (Au), silver (Ag), and alloys thereof.

In some example embodiments, a first protective film 176 may cover the first connecting structure 350 and the first pad 355. For example, the first protective film 176 may extend along the profiles of the first connecting structure 350 and the first pad 355.

The second connecting structure 450 may be formed inside the connecting region CR. The second connecting structure 450 may be formed on the surface insulating film 170 of the connecting region CR. The second connecting structure 450 may electrically connect the first wiring structure 160 and the second wiring structure 240. For example, a second trench 455t that exposes the second wiring pattern 163 and the fourth wiring pattern 234 may be formed inside the connecting region CR. The second connecting structure 450 may be formed inside the second trench 455t to connect the second wiring pattern 163 and the fourth wiring pattern 234. In some example embodiments, the second connecting structure 450 may extend along profiles of the side surfaces and the lower surface of the second trench 455t.

The second connecting structure 450 may include, for example, but not limited to, at least one of titanium (Ti), titanium nitride (TiN), tantalum (Ta), tantalum nitride (TaN), tungsten (W), aluminum (Al), copper (Cu), and combinations thereof. In some example embodiments, the second connecting structure 450 may be formed at the same level as the first connecting structure 350.

In some example embodiments, the first protective film 176 may cover the second connecting structure 450. For example, the first protective film 176 may extend along the profile of the second connecting structure 450.

In some example embodiments, a first filling insulating film 460 that fills the second trench 455t may be formed on the second connecting structure 450. The first filling insulating film 460 may include, for example, but not limited to, at least one of silicon oxide, aluminum oxide, tantalum oxide, and combinations thereof.

The third connecting structure 550 may be formed inside the pad region PR. The third connecting structure 550 may be formed on the surface insulating film 170 of the pad region PR. The third connecting structure 550 may electrically connect the second wiring structure 240 to an external device or the like. For example, a third trench 550t that exposes the fifth wiring pattern 236 may be formed inside the pad region PR. The third connecting structure 550 may be formed inside the third trench 550t and be in contact with the fifth wiring pattern 236. Further, a fourth trench 555t may be formed inside the first substrate 100 of the pad region PR. The third connecting structure 550 may be formed inside the fourth trench 555t and exposed. In some example embodiments, the third connecting structure 550 may extend along profiles of the side surfaces and the lower surface of the third trench 550t and the fourth trench 555t.

The third connecting structure 550 may include, for example, but not limited to, at least one of titanium (Ti), titanium nitride (TiN), tantalum (Ta), tantalum nitride (TaN), tungsten (W), aluminum (Al), copper (Cu) and combinations thereof. In some example embodiments, the third connecting structure 550 may be formed at the same level as those of the first connecting structure 350 and the second connecting structure 450.

In some example embodiments, a second filling insulating film 560 that fills the third trench 550t may be formed on the third connecting structure 550. The second filling insulating film 560 may include, for example, but not limited to, at least one of silicon oxide, aluminum oxide, tantalum oxide, and combinations thereof. In some example embodiments, the second filling insulating film 560 may be formed at the same level as that of the first filling insulating film 460.

In some example embodiments, a second pad 555 that fills the fourth trench 555t may be formed on the third connecting structure 550. The second pad 555 may include, for example, but not limited to, at least one of tungsten (W), copper (Cu), aluminum (Al), gold (Au), silver (Ag), and alloys thereof. In some example embodiments, the second pad 555 may be formed at the same level as that of the first pad 355.

In some example embodiments, the first protective film 176 may cover the third connecting structure 550. For example, the first protective film 176 may extend along the profile of the third connecting structure 550. In some example embodiments, the first protective film 176 may expose the second pad 555.

In some example embodiments, an isolation pattern 115 may be formed inside the first substrate 100. Although the isolation pattern 115 is shown as being formed only around the second connecting structure 450 and around the third connecting structure 550, this is merely an example. For example, the isolation pattern 115 may also be formed around the first connecting structure 350. The isolation pattern 115 may include, for example, but not limited to, at least one of silicon oxide, silicon nitride, silicon oxynitride, aluminum oxide, hafnium oxide, and combinations thereof.

In various example embodiments, the width of the isolation pattern 115 may decrease from the second side 102b of the first substrate 100 toward the first side 100a of the first substrate 100. This may be due to the characteristics of the etching process for forming the isolation pattern 115. For example, the isolation pattern 115 may be a BDTI (backside deep trench isolation) formed by a DTI (deep trench isolation) process on the back side of the first substrate 100. In some example embodiments, the isolation pattern 115 may be separated from the first side 100a of the first substrate 100.

In some example embodiments, a photo-shielding color filter 170C may be formed on the first connecting structure 350 and the second connecting structure 450. For example, the photo-shielding color filter 170C may be formed to cover a part of the first protective film 176 inside the photo-shielding region OB and the connecting region CR. The photo-shielding color filter 170C may shield the light that is incident on the first substrate 100.

In some example embodiments, a third protective film 380 may be formed on the photo-shielding color filter 170C. For example, the third protective film 380 may be formed to cover a part of the first protective film 176 inside the photo-shielding region OB, the connecting region CR, and the pad region PR. In some example embodiments, the second protective film 185 may extend along the surface of the third protective film 380. The third protective film 380 may include, for example, but not limited to, a light transmissive resin. In some example embodiments, the third protective film 380 may be formed at the same level as that of the microlens 190.

In some example embodiments, the second protective film 185 and the third protective film 380 may expose the second pad 555. For example, an exposure opening ER that exposes the second pad 555 may be formed inside the second protective film 185 and the third protective film 380. Therefore, the second pad 555 may be connected to an external device or the like and configured to transmit and receive electrical signals between the image sensor according to some example embodiments and the external device. That is, the second pad 555 may be an I/O pad of the image sensor according to some example embodiments.

Hereinafter, a method for fabricating an image sensor according to an example embodiment will be described referring to FIGS. 1 to 26.

FIGS. 17 to 26 are intermediate stage diagrams for explaining a method for fabricating an image sensor according to some example embodiments. For convenience of explanation, repeated parts of contents explained using FIGS. 1 to 16 will be briefly described or omitted.

Figure 17:
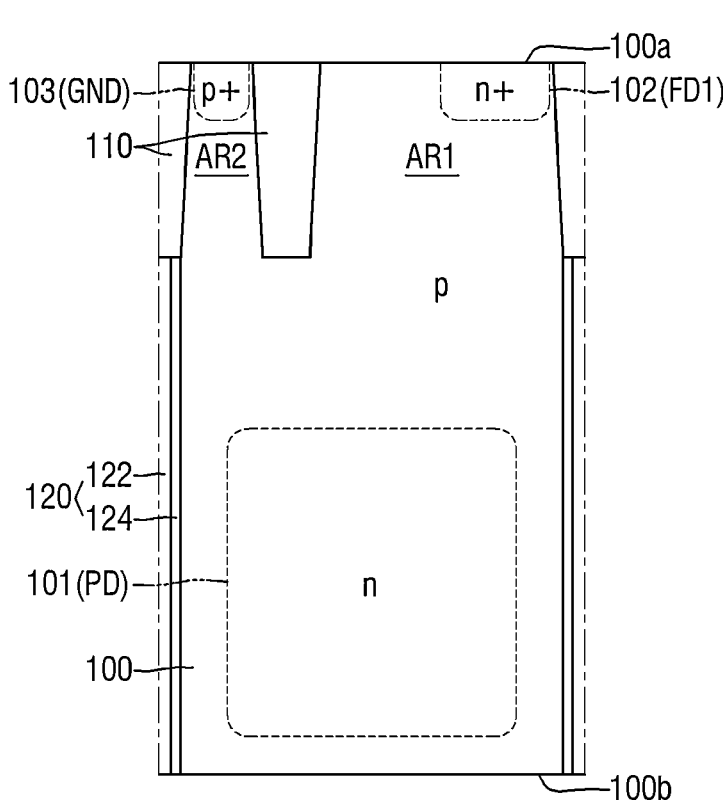

Referring to FIG. 17, the first substrate 100 including the photoelectric conversion region 101 is provided.

The first substrate 100 may include a first side 100a and a second side 100b that are opposite to each other. In some example embodiments, the first substrate 100 may have a first conductive type (e.g., p-type).

The photoelectric conversion region 101 may be formed inside the first substrate 100. The photoelectric conversion region 101 may have a second conductive type (e.g., n-type) different from the first conductive type.

A plurality of active regions (e.g., first to third active regions AR1 to AR3) separated by the element separation pattern 110 may be formed inside the first substrate 100. In some example embodiments, the element separation pattern 110 may be formed of a multiple film. For example, the element separation pattern 110 may include the insulating liner 112, the etching blocking liner 114, and the gap fill insulating film 116 explained above using FIG. 8.

Further, the first floating diffusion region FD1 may be formed inside the first substrate 100. For example, the first floating diffusion region FD1 may be the first impurity region 102 formed by ion-implantation of n-type impurities into the p-type first substrate 100.

In some example embodiments, a ground region GND may be formed inside the first substrate 100. For example, the ground region GND may be the second impurity region 103 formed by ion-implantation of p-type impurities (p+) of a high concentration into the p-type first substrate 100.

Figure 18:
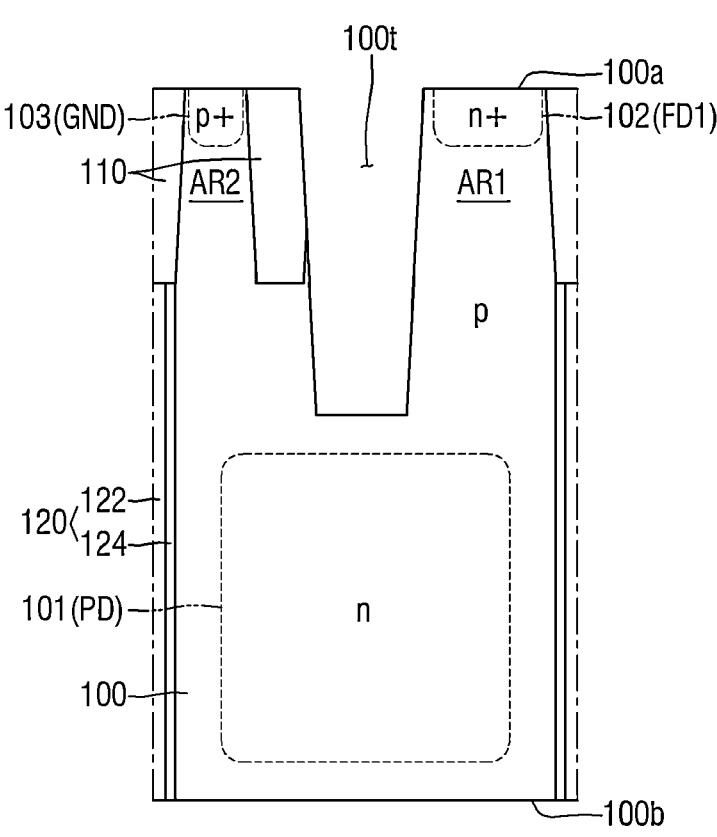

Referring to FIG. 18, the substrate trench 100t is formed in the first substrate 100.

The substrate trench 100t may extend from the first side 100a of the first substrate 100. The substrate trench 100t may be formed inside the first substrate 100 between the photo-electric conversion region 101 and the first floating diffusion region FD1. In some example embodiments, the substrate trench 100t may overlap the first active region AR1 and the element separation pattern 110.

In some example embodiments, the width of the substrate trench 100t may decrease as it goes away from the first side 100a of the first substrate 100. This may be due to the characteristics of the etching process for forming the substrate trench 100t.

Figure 19:
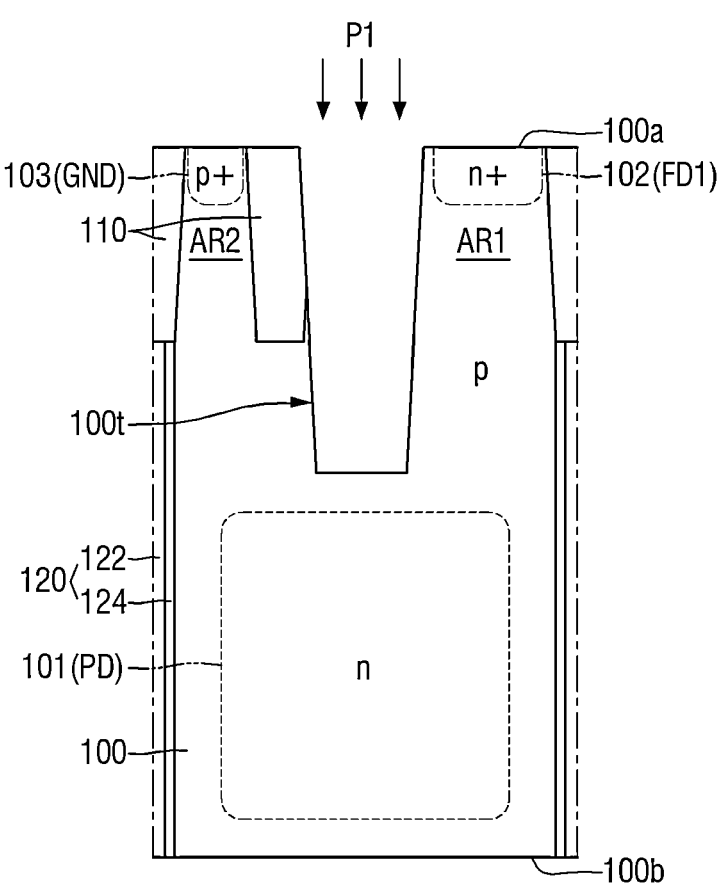

Referring to FIG. 19, a first surface treatment process P1 is performed on the substrate trench 100t.

As the first surface treatment process P1 is performed, the surface of the first substrate 100 exposed from the substrate trench 100t may be cured. For example, a dangling bond of the surface of the first substrate 100 formed in the etching process for forming the substrate trench 100t may be cured by the first surface treatment process P1.

In some example embodiments, the first surface treatment process P1 may include an ion implantation (IIP) process. In one example, the first surface treatment process P1 may include a boron ion implantation (B-IIP) process.

In some example embodiments, the first surface treatment process P1 may include a tilting ion implantation (tilt IIP) process. A tilting angle of the tilting ion implantation process on a vertical plane may be, for example, but not limited to, from about 1° to about 10°. Through the tilting ion implantation process, a curing efficiency for the substrate trench 100t may be improved.

In some example embodiments, the first surface treatment process P1 may include tilting ion implantation processes performed multiple times. For example, the first surface treatment process P1 may include a first tilting ion implantation process, and a second tilting ion implantation process performed after the first tilting ion implantation process. Through the tilting ion implantation process performed multiple times, the curing efficiency for the substrate trench 100t may be improved. In some example embodiments, the tilting angle of the first tilting ion implantation process and the tilting angle of the second tilting ion implantation process may be different from each other. As an example, the tilting angle of the first tilting ion implantation process may be from about 5° to about 10°, and the tilting angle of the second tilting ion implantation process may be from about 1° to about 5°.

Figure 20:
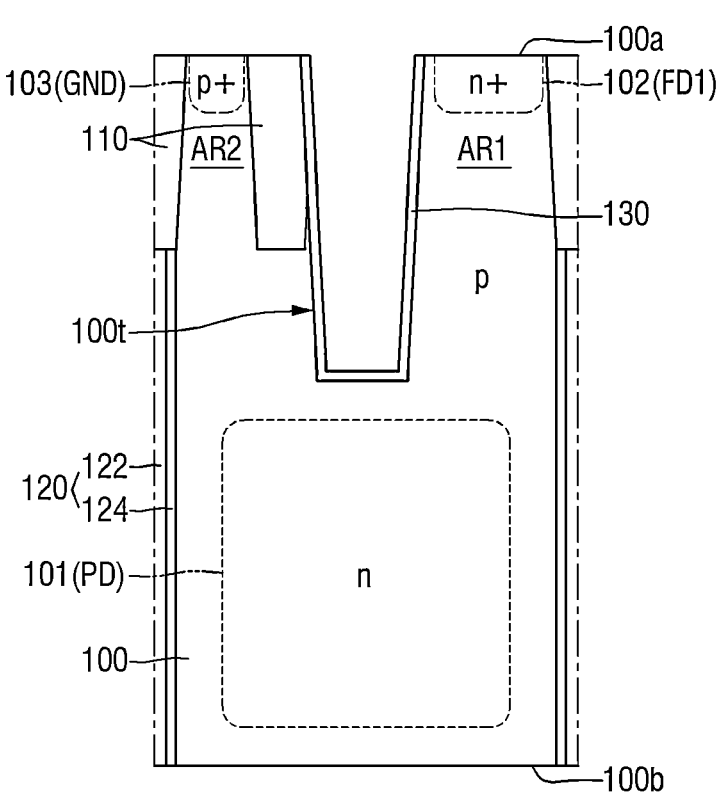

Referring to FIG. 20, the gate dielectric film 130 is formed inside the substrate trench 100t.

For example, a preliminary dielectric film may be deposited on the first substrate 100 and the element separation pattern 110. Subsequently, the preliminary dielectric film on the first side 100a of the first substrate 100 and the upper surface of the element separation pattern 110 may be removed. Accordingly, the gate dielectric film 130 that conformally extends along the profiles of the side surfaces and the lower surface of the substrate trench 100t may be formed.

The gate dielectric film 130 may include, for example, but not limited to, at least one of silicon oxide, silicon nitride, silicon oxynitride, and low dielectric constant (low-k) material having a lower dielectric constant than silicon oxide.

Figure 21:
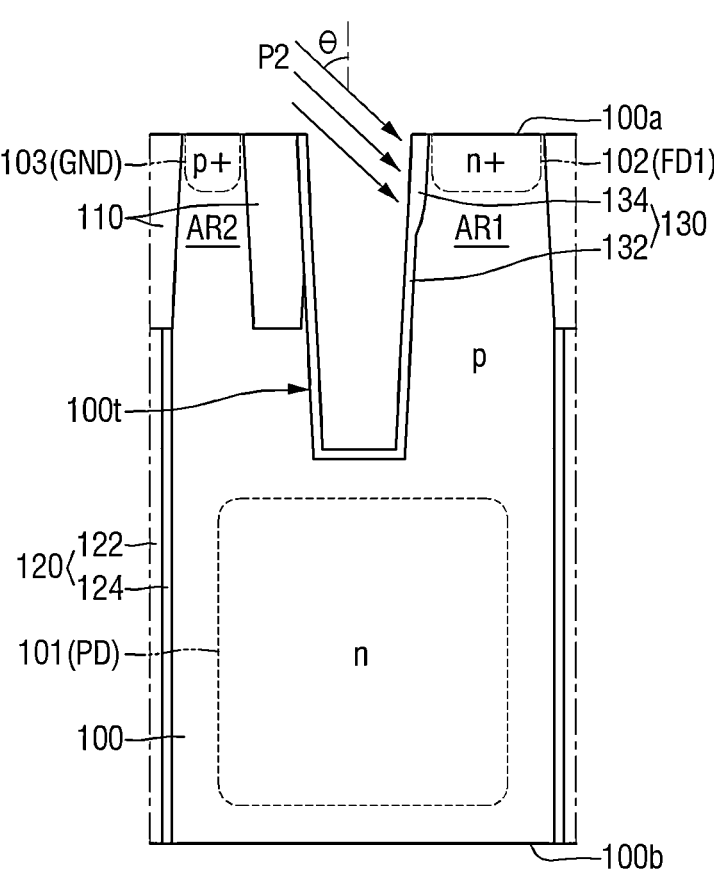

Referring to FIG. 21, the second surface treatment process P2 is selectively performed on the gate dielectric film 130 adjacent to the first floating diffusion region FD1.

The second surface treatment process P2 may include an ion implantation (IIP) process. In some example embodiments, the second surface treatment process (P2) may include a fluorine ion implantation (F-IIP) process.

As the second surface treatment process P2 is performed, the thickness of the gate dielectric film 130 adjacent to the first floating diffusion region FD1 may selectively increase. For example, the fluorine ion selectively implanted into the gate dielectric film 130 adjacent to the first floating diffusion region FD1 may replace the oxygen (O) atom of silicon-oxygen (Si—O) bond that is relatively weak at the boundary between the gate dielectric film 130 and the first substrate 100. The excess oxygen (O) atom desorbed at this time may be bonded to the silicon (Si) atom to increase the thickness of the gate dielectric film 130. Therefore, the gate dielectric film 130 including the lower dielectric film 132 and the upper dielectric film 134 may be formed. Further, as described above in FIG. 7, a boundary film 100f including a silicon-fluorine (Si—F) bond may be formed in the first substrate 100.

In some example embodiments, the second surface treatment process P2 may include a tilting ion implantation (tilt IIP) process. The tilting angle θ of the tilting ion implantation process on the vertical plane may be, for example, from about 1° to about 10°, preferably from about 3° to about 7°. Through the tilting ion implantation process, fluorine ions may be selectively implanted into the upper part of the gate dielectric film 130 adjacent to the first floating diffusion region FD1. In an example, the tilting ion implantation process may be performed, but not limited to, with energy of about 9 keV to about 13 keV in a quad mode. The ion implantation concentration according to the tilting ion implantation process may be, but not limited to, about 2E15 at/cm³ to about 4E15 at/cm³.

Figure 22:
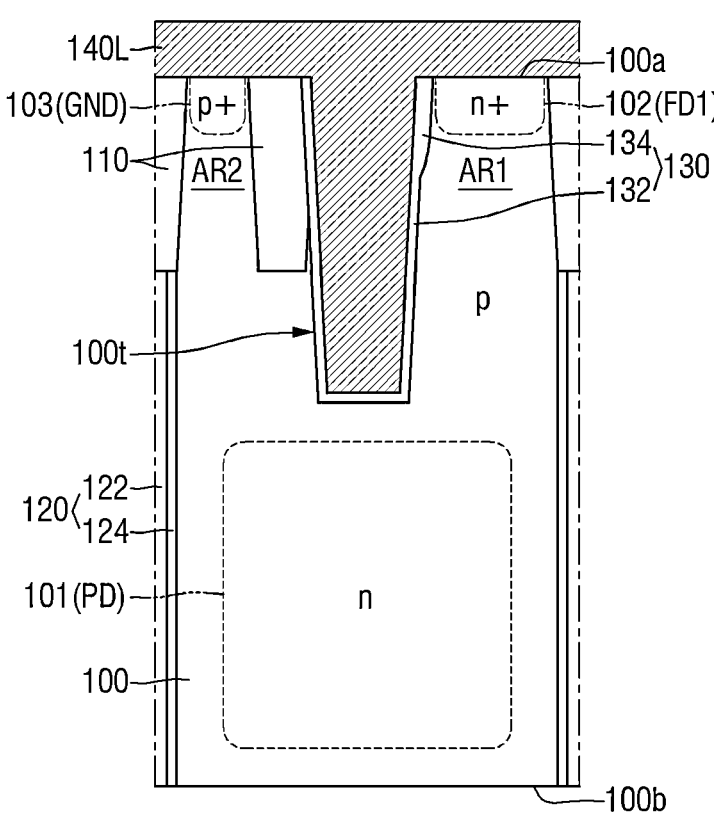

Referring to FIG. 22, a preliminary electrode film 140L is formed on the gate dielectric film 130.

The preliminary electrode film 140L may be formed to fill the substrate trench 100t. As a result, the lower surface of the preliminary electrode film 140L may be formed to be lower than the first side 100a of the first substrate 100. The preliminary electrode film 140L may include, for example, but not limited to, at least one of impurity-doped polysilicon (poly-Si), a metal silicide such as cobalt silicide, a metal nitride such as titanium nitride, and a metal such as tungsten, copper and aluminum.

Figure 23:
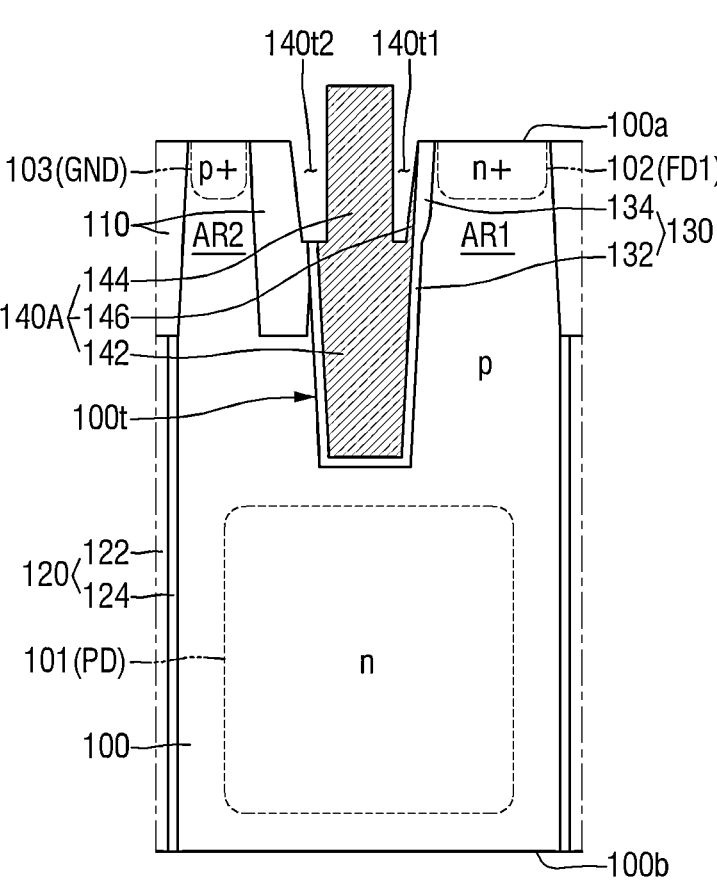

Referring to FIGS. 22 and 23, a patterning process is performed on the preliminary electrode film 140L.

For example, the first gate trench 140t1 and the second gate trench 140t2 may be formed in the upper part of the preliminary electrode film 140L. Therefore, the first transfer gate electrode 140A including the lower gate 142 and the upper gate 144 may be formed.

In some example embodiments, the first transfer gate electrode 140A may further include the residual gate film 146. The residual gate film 146 may be a residual film that remains from the preliminary electrode film 140L in the process of forming the first gate trench 140t1.

In some example embodiments, a part of the second gate trench 140t2 may overlap a part of the element separation pattern 110. In this case, the preliminary electrode film 140L may not remain in the process of forming the second gate trench 140*t*2.

Figure 24:
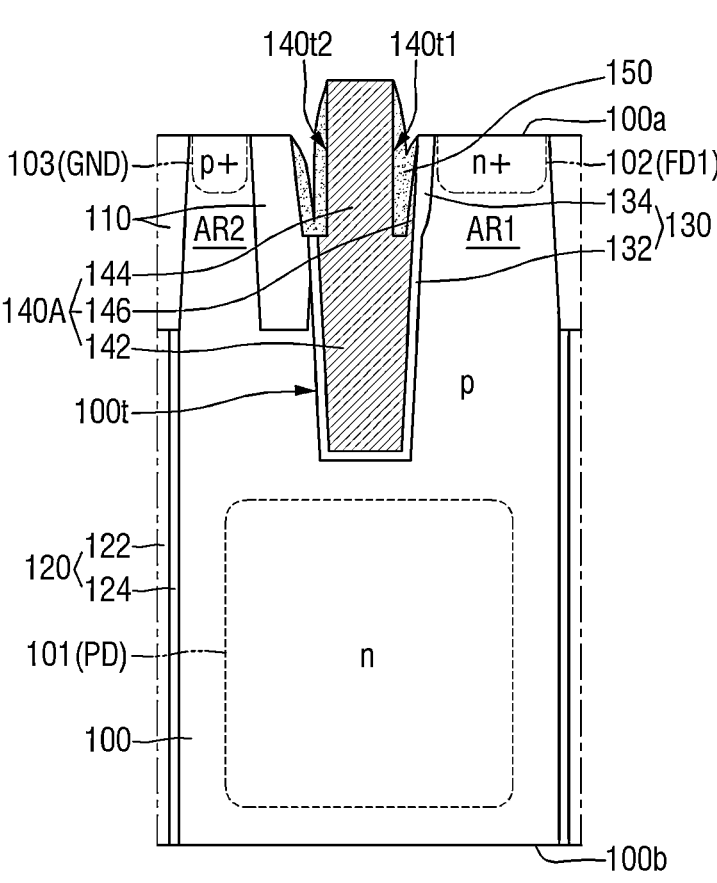

Referring to FIG. 24, the gate spacer 150 is formed inside the first gate trench 140*t*1 and the second gate trench 140*t*2.

The upper gate 144 may be spaced apart from the upper dielectric film 134 by the gate spacer 150. In some example embodiments, the upper gate 144 may be spaced apart from the residual gate film 146 by the gate spacer 150.

The upper gate 144 may be spaced apart from the element separation pattern 110 by the gate spacer 150. In some example embodiments, a part of the gate spacer 150 may overlap a part of the element separation pattern 110.

The gate spacer 150 may include, but not limited to, for example, at least one of silicon oxide, silicon nitride, silicon oxynitride, and combinations thereof. In an example, the gate spacer 150 may include a silicon nitride film.

Figure 25:
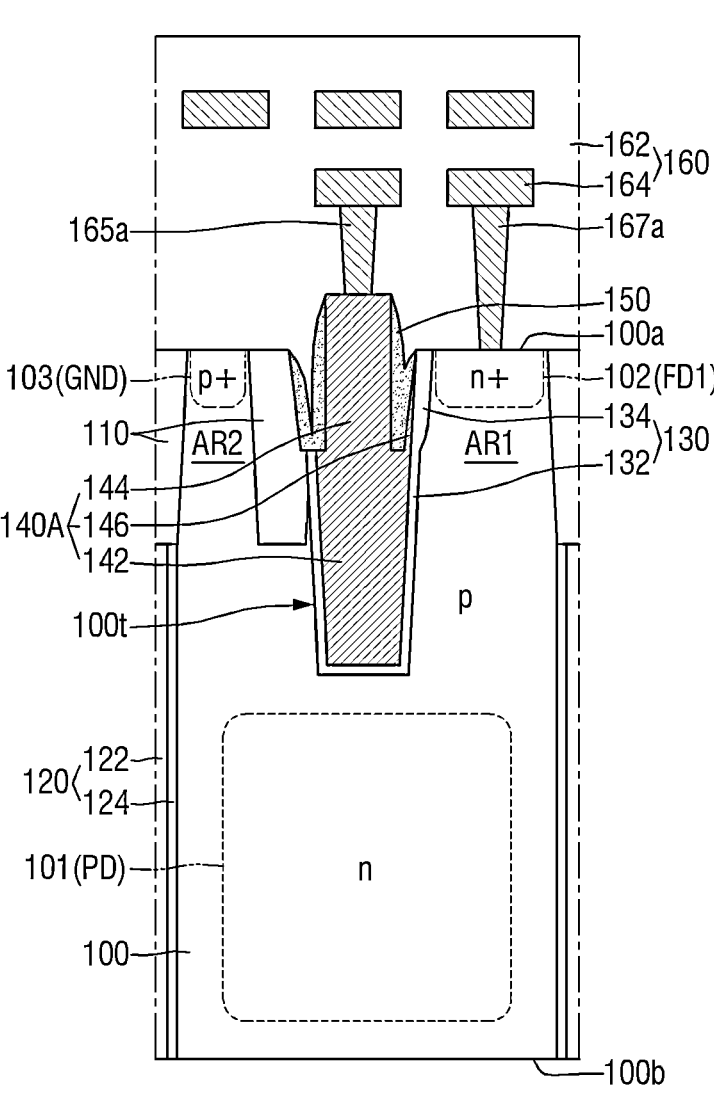

Referring to FIG. 25, the first wiring structure 160 is formed.

The first wiring structure 160 may be formed on the first side 100*a* of the first substrate 100. The first wiring structure 160 may include a plurality of wiring patterns. For example, the first wiring structure 160 may include a first inter-wiring insulating film 162, and a first wiring pattern 164 inside the first inter-wiring insulating film 162.

Subsequently, referring to FIG. 4, the surface insulating film 170, the grid patterns 172 and 174, the color filter 180, and the microlens 190 are sequentially formed on the second side 100*b* of the first substrate 100. The image sensor explained above using FIGS. 3 to 7 may be fabricated accordingly.

In concluding the detailed description, those of ordinary skill in the art will appreciate that many variations and modifications may be made to various example embodiments without substantially departing from the principles of the inventive concepts. Therefore, example embodiments are used in a generic and descriptive sense only and not for purposes of limitation. Furthermore example embodiments are not necessarily mutually exclusive with one another. For example, some example embodiments may include one or more features described with reference to one or more figures, and may also include one or more other features described with reference to one or more other figures.

What is claimed is:

1. An image sensor comprising:
a substrate;
a photoelectric conversion region in the substrate;
the substrate defining a substrate trench over the photoelectric conversion region;
a floating diffusion region adjacent to a side surface of the substrate trench, in the substrate;
a gate dielectric film that extends along the side surface and a lower surface of the substrate trench; and
a transfer gate electrode on the gate dielectric film which includes a lower gate that fills a portion of the substrate trench and has a first width, and an upper gate on the lower gate that has a second width smaller than the first width,
wherein the gate dielectric film includes a lower dielectric film which is interposed between the substrate and the lower gate and has a first thickness, and an upper dielectric film which is adjacent to the floating diffusion region and has a second thickness greater than the first thickness,
wherein a first gate trench is defined by an upper surface of the lower gate, a first side surface of the upper gate, and an element separation pattern, and wherein a second gate trench is defined by the upper surface of the lower gate, a second side surface of the upper gate, and the upper dielectric film.

2. The image sensor of claim 1, wherein the photoelectric conversion region and the floating diffusion region include impurities of a same conductive type.

3. The image sensor of claim 1, wherein the upper dielectric film extends from the lower dielectric film to a surface of the substrate.

4. The image sensor of claim 3, wherein a depth of the upper dielectric film is deeper than a depth of the floating diffusion region, on the basis of the surface of the substrate.

5. The image sensor of claim 1,
wherein the element separation pattern defines an active region of the substrate, the element separation pattern being in the substrate,
wherein the floating diffusion region is in the active region, and
at least a portion of the substrate trench overlaps the active region.

6. The image sensor of claim 5, wherein a depth of the substrate trench is deeper than a depth of the element separation pattern, on the basis of the surface of the substrate.

7. The image sensor of claim 1, further comprising:
a boundary film including a fluorine (F) atom, in the substrate adjacent to the upper dielectric film.

8. The image sensor of claim 1, wherein the transfer gate electrode further comprises a residual gate film on the lower gate that is spaced apart from the upper gate and extends along a profile of the upper dielectric film.

9. The image sensor of claim 8, further comprising:
a gate spacer interposed between the upper gate and the residual gate film and on the lower gate.

10. The image sensor of claim 1, wherein the transfer gate electrode includes a polysilicon film.

11. The image sensor of claim 1, wherein the gate dielectric film includes a silicon oxide film.

12. An image sensor comprising:
a substrate;
a photoelectric conversion region in the substrate; the substrate defining a substrate trench on the photoelectric conversion region;
a floating diffusion region adjacent to a side surface of the substrate trench and in the substrate; a gate dielectric film that extends along the side surface and a lower surface of the substrate trench;
a transfer gate electrode on the gate dielectric film which includes a lower gate that fills a portion of the substrate trench, an upper gate on the lower gate that is spaced apart from a side surface of the gate dielectric film, and a residual gate film on the lower gate that extends along the gate dielectric film; and
a gate spacer interposed between the upper gate and the residual gate film and on the lower gate,
wherein the gate dielectric film includes a lower dielectric film which is interposed between the substrate and the lower gate and has a first thickness, and an upper dielectric film which is interposed between the floating diffusion region, and the residual gate film and has a second thickness greater than the first thickness;
wherein a first gate trench is defined by an upper surface of the lower gate and a first side surface of the upper gate,
wherein a second gate trench is defined by the upper surface of the lower gate, a second side surface of the upper gate, and the upper dielectric film, and wherein the gate spacer fills at least a portion of the second gate trench.

13. The image sensor of claim 12, wherein the lower gate, the upper gate, and the residual gate film are integral.

14. The image sensor of claim 12, further comprising:

an element separation pattern that defines an active region of the substrate, in the substrate, wherein the floating diffusion region is in the active region, the substrate trench overlaps the active region and the element separation pattern, and the gate spacer is further interposed between the upper gate and the element separation pattern.

15. The image sensor of claim 14, wherein a portion of the gate dielectric film is not interposed between the upper gate and the element separation pattern.

16. The image sensor of claim 12, further comprising:

a boundary film including a fluorine (F) atom, in the substrate adjacent to the upper dielectric film.

17. The image sensor of claim 12, wherein a depth of formation of the upper dielectric film on the basis of the surface of the substrate is 1 Å (0.1 nm) to 1100 Å (110.0 nm).

18. The image sensor of claim 12, wherein a first width of the lower gate is greater than a second width of the upper gate.

19. An image sensor comprising:

a first substrate including a first side and a second side opposite to each other;

a photoelectric conversion region in the first substrate;

a transfer gate electrode which is at least partially embedded in the first substrate and on the first side of the first substrate;

a gate dielectric film interposed between the first substrate and the transfer gate electrode;

a floating diffusion region adjacent to a side surface of the transfer gate electrode and in the first substrate;

a first wiring structure electrically connected to at least one of the transfer gate electrode or the floating diffusion region and on the first side of the first substrate; and a microlens on the second side of the first substrate, wherein the transfer gate electrode includes a lower gate adjacent to the photoelectric conversion region, and an upper gate spaced apart from a side surface of the gate dielectric film, and the gate dielectric film includes a lower dielectric film which is interposed between the first substrate and the lower gate and has a first thickness, and an upper dielectric film which is adjacent to the floating diffusion region and has a second thickness greater than the first thickness, wherein a first gate trench is defined by an upper surface of the lower gate, a first side surface of the upper gate, and an element separation pattern, and wherein a second gate trench is defined by the upper surface of the lower gate, a second side surface of the upper gate, and the upper dielectric film.

20. The image sensor of claim 19, further comprising:

a second substrate which includes a third side facing the first side of the first substrate, and a fourth side opposite to the third side;

a peripheral circuit element on the third side of the second substrate; and a second wiring structure electrically connected to the peripheral circuit element, on the third side of the second substrate, wherein the second wiring structure is attached onto the first wiring structure.

* * * * *